United States Patent
Hibbs-Brenner et al.

(10) Patent No.: US 9,088,134 B2
(45) Date of Patent: Jul. 21, 2015

(54) METHOD AND APPARATUS INCLUDING IMPROVED VERTICAL-CAVITY SURFACE-EMITTING LASERS

(75) Inventors: Mary K. Hibbs-Brenner, Plymouth, MN (US); Klein L. Johnson, Orono, MN (US); Matthew M. Dummer, Minneapolis, MN (US)

(73) Assignee: Vixar Inc., Plymouth, MN (US)

( * ) Notice: Subject to any disclaimer, the term of this patent is extended or adjusted under 35 U.S.C. 154(b) by 0 days.

(21) Appl. No.: 13/559,821

(22) Filed: Jul. 27, 2012

(65) Prior Publication Data

US 2013/0034117 A1 Feb. 7, 2013

Related U.S. Application Data

(60) Provisional application No. 61/512,333, filed on Jul. 27, 2011, provisional application No. 61/581,594, filed on Dec. 29, 2011.

(51) Int. Cl.
*H01S 5/183* (2006.01)
*H01S 5/20* (2006.01)

(52) U.S. Cl.
CPC ........... *H01S 5/1833* (2013.01); *H01S 5/18333* (2013.01); *H01S 5/18336* (2013.01); *H01S 5/18305* (2013.01); *H01S 5/18308* (2013.01); *H01S 5/18311* (2013.01); *H01S 5/18341* (2013.01); *H01S 5/18358* (2013.01); *H01S 5/18369* (2013.01); *H01S 5/18394* (2013.01);
(Continued)

(58) Field of Classification Search
CPC .. H01S 5/183; H01S 5/18305; H01S 5/18308
USPC .............................. 372/45.01, 50.124; 438/29
See application file for complete search history.

(56) References Cited

U.S. PATENT DOCUMENTS

| 5,893,722 A | 4/1999 | Hibbs-Brenner et al. |
| 5,903,588 A * | 5/1999 | Guenter et al. .......... 372/46.013 |
| 6,665,109 B2 | 12/2003 | Little et al. |

(Continued)

FOREIGN PATENT DOCUMENTS

WO  03084010  10/2003

OTHER PUBLICATIONS

International Search Report and Written Opinion for related PCT Application No. PCT/US2012/048661 mailed Feb. 28, 2013 (8 pp.).

(Continued)

*Primary Examiner* — Tuan Nguyen
(74) *Attorney, Agent, or Firm* — Winthrop & Weinstine, P.A.

(57) ABSTRACT

VCSELs and methods having improved characteristics. In some embodiments, these include a semiconductor substrate; a vertical-cavity surface-emitting laser (VCSEL) on the substrate; a first electrical contact formed on the VCSEL; a second electrical contact formed on the substrate, wherein the VCSEL includes: a first resonating cavity having first and second mirrors, at least one of which partially transmits light incident on that mirror, wherein the first second mirrors are electrically conductive. A first layer is between the first mirror and the second mirror and has a first aperture that restricts the path of current flow. A second layer is between the first layer and the second mirror and also restricts the electrical current path. A multiple-quantum-well (MQW) structure is between the first mirror and the second mirror, wherein the first and second apertures act together to define a path geometry of the current through the MQW structure.

28 Claims, 31 Drawing Sheets

(52) U.S. Cl.
CPC ......... *H01S 5/2063* (2013.01); *H01S 2301/166* (2013.01)

(56) References Cited

U.S. PATENT DOCUMENTS

| | | | |
|---|---|---|---|
| 7,359,421 | B2 | 4/2008 | Brenner et al. |
| 7,557,470 | B2 | 7/2009 | Culpepper et al. |
| 7,719,693 | B2 | 5/2010 | Osborn et al. |
| RE41,738 | E | 9/2010 | Brenner et al. |
| 8,002,933 | B2 | 8/2011 | Unger et al. |
| 8,249,121 | B2 | 8/2012 | Brenner et al. |
| 8,494,018 | B2 | 7/2013 | Brenner et al. |
| 2002/0125324 | A1 | 9/2002 | Yavid et al. |
| 2003/0031221 | A1 | 2/2003 | Wang et al. |
| 2005/0271092 | A1* | 12/2005 | Ledentsov et al. .............. 372/20 |
| 2008/0279229 | A1* | 11/2008 | Suzuki et al. ................... 372/19 |
| 2009/0041464 | A1* | 2/2009 | Ledentsov et al. .............. 398/87 |
| 2009/0296754 | A1* | 12/2009 | Ledentsov et al. .............. 372/20 |
| 2010/0046565 | A1 | 2/2010 | Masui et al. |
| 2010/0220758 | A1* | 9/2010 | Brenner et al. ............ 372/45.01 |
| 2012/0120976 | A1 | 5/2012 | Budd et al. |

OTHER PUBLICATIONS

U.S. Appl. No. 61/208,200, filed Feb. 20, 2009, Brenner et al.
U.S. Appl. No. 61/512,333, filed Jul. 27, 2011, Hibbs-Brenner et al.
M.C. Nowell et al. "Low-Chirp and Enhanced-Resonant Frequency by Direct Push-Pull Modulation of DFB Lasers." IEEE Journal Selected Topics of Quantum Electronics, vol. 1, No. 2, pp. 433-441, Jun. 1995.
J. Chen et al. "Dynamic Properties of Push-Pull DFB Semiconductor Lasers." IEEE Journal of Quantum Electronics, vol. 32, No. 12, pp. 2156-2165, Dec. 1996.
P. Pellandini et al. Dual-wavelength laser emission from a coupled semiconductor microcavity. Applied Physics Letters, vol. 71, No. 7, pp. 864-866, Aug. 18, 1997.
A.J. Fischer et al. "Coupled resonator vertical-cavity laser diode." Applied Physics Letters, vol. 75, No. 19, pp. 3020-3022, Nov. 8, 1999.
V. Badilita et al. "Rate-Equation Model for Coupled-Cavity Surface-Emitting Lasers." IEEE Journal of Quantum Electronics, vol. 40, No. 12, pp. 1646-1656, Dec. 2004.
A.C. Lehman et al. "Threshold Gain Temperature Dependence of Composite Resonator Vertical-Cavity Lasers." IEEE Journal Selected Topics of Quantum Electronics, vol. 11, No. 5, pp. 962-967, Sep./Oct. 2005.
D.M. Grasso et al. "Direct Modulation Characteristics of Composite Resonator Vertical-Cavity Lasers." IEEE Journal of Quantum Electronics, vol. 42, No. 12, pp. 1248-1254, Dec. 2006.
V.A. Shchukin et al. "Ultrahigh-speed electrooptically-modulated VCSELs: modeling and experimental results." in Proceedings of SPIE, vol. 6889, 2008.
J. van Eisen et al. "Optically Decoupled Loss Modulation in a Duo-Cavity VCSEL." IEEE Photonics Technology Letters, vol. 20, No. 1, pp. 42-44, Jan. 1, 2008.
C. Chen et al. "High-speed electroabsorption modulation of composite-resonator vertical-cavity lasers." IET Optoelectronics, vol. 3, No. 2, pp. 93-99, 2009.
C. Chen et al. "Multilevel Amplitude Modulation Using a Composite-Resonator Vertical-Cavity Laser." IEEE Photonics Technology Letters, vol. 21, No. 15, Aug. 1, 2009.
C. Chen et al. "Microwave Frequency Conversion Using a Coupled Cavity Surface-Emitting Laser." IEEE Photonics Technology Letters, vol. 21, No. 19, pp. 1393-1395, Oct. 1, 2009.
Bohr, Mark et al. "Intel's Revolutionary 22 nm Transistor Technology", Intel, May 2011 (28 pp.).
Chen, Chen et al. "Push-Pull Modulation of a Composite-Resonator Vertical-Capacity Laser", IEEE Journal of Quantum Electronics, vol. 46, No. 4, Apr. 2010 (pp. 438-446).
Young, E.W. et al. "Single-Transverse-Mode Vertical-Cavity Lasers Under Continuous and Pulsed Operation", IEEE Photonics Technology Letters, vol. 13, No. 9, Sep. 2001 (pp. 927-929).
Johnson, Klein et al. "Record High Temperature High Output Power Red VCSELs", Vixar, Photonics West 2011, Jan. 26, 2011 (14 pgs.).
Johnson, Klein et al. "Record High Temperature High Output Power Red VCSELs", SPIE Proceedings vol. 7952, 795208, Feb. 3, 2011 (12 pgs.).

* cited by examiner

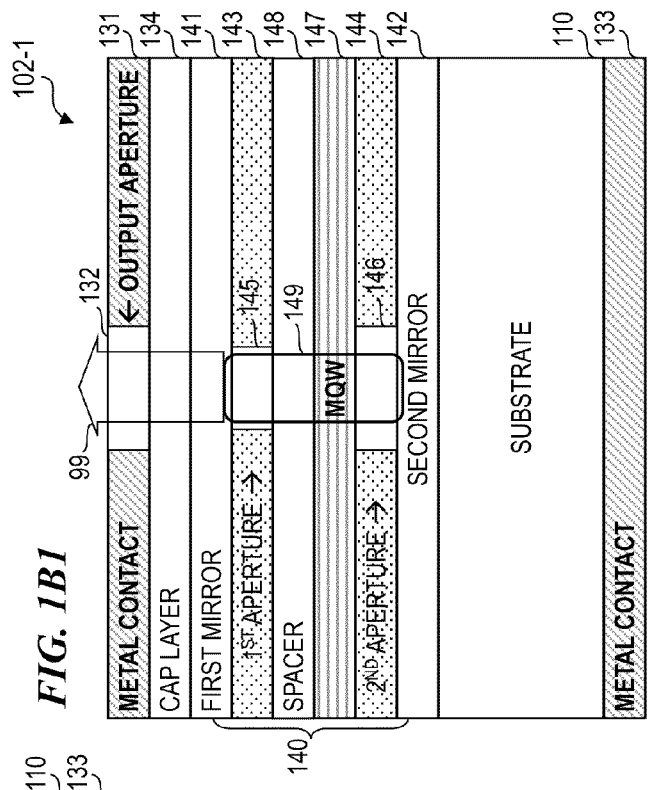
FIG. 1B1
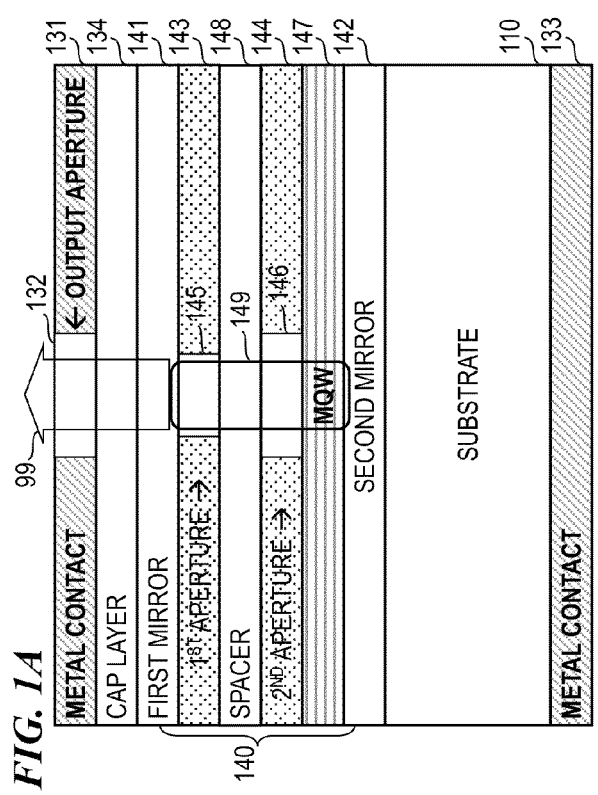
FIG. 1A

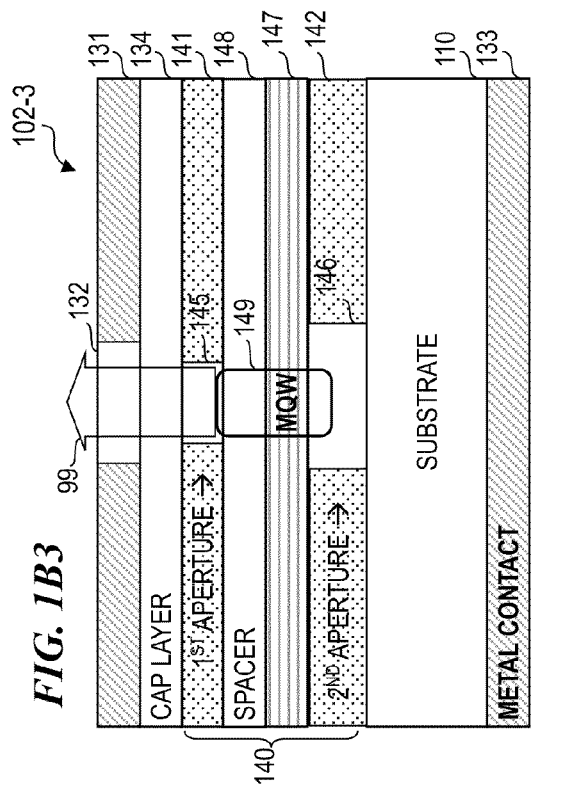
FIG. 1B3
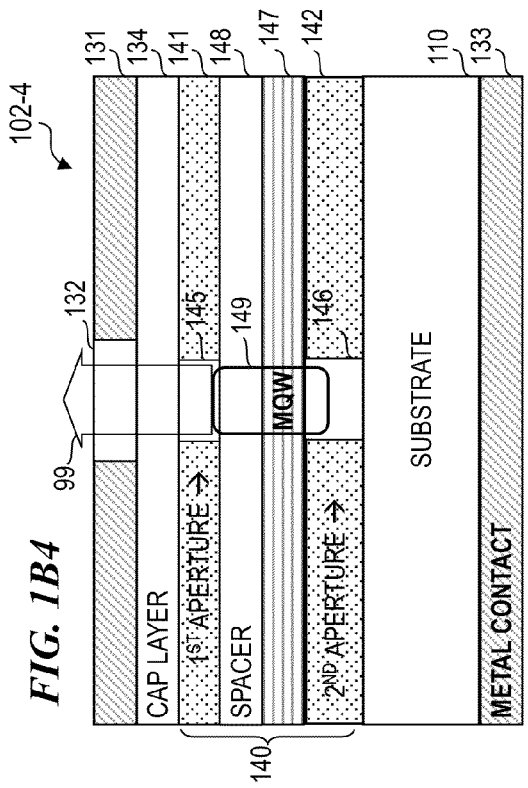
FIG. 1B4
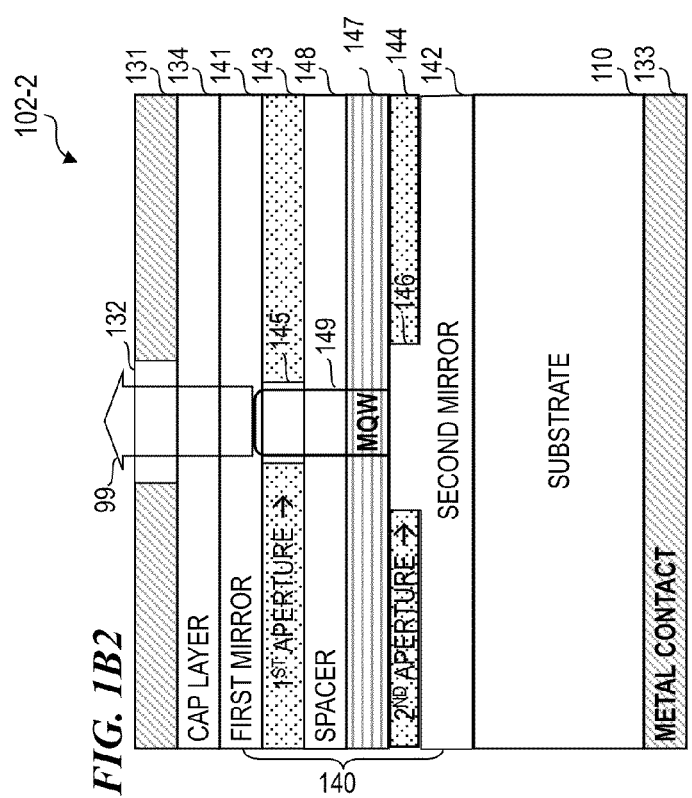
FIG. 1B2

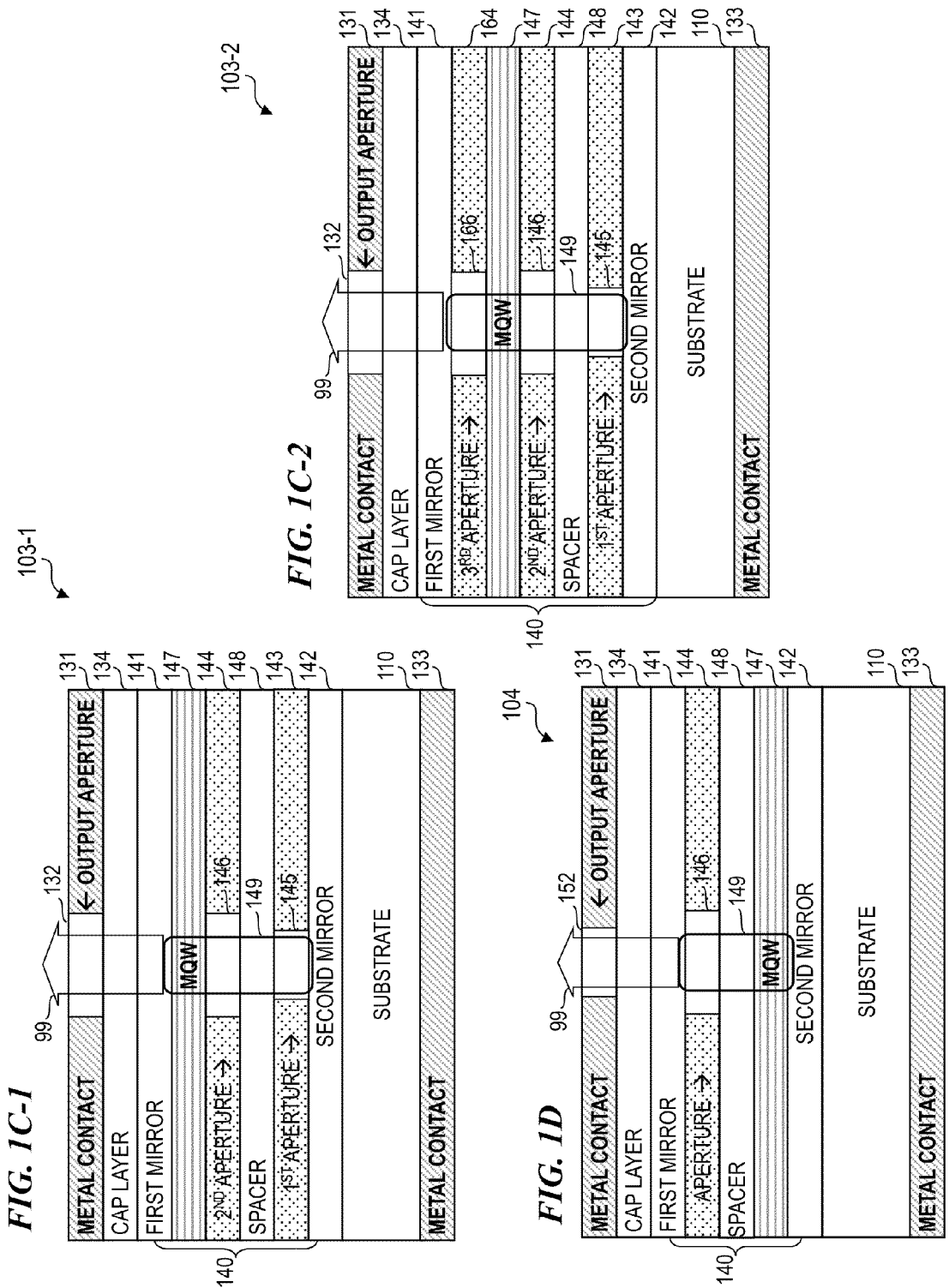

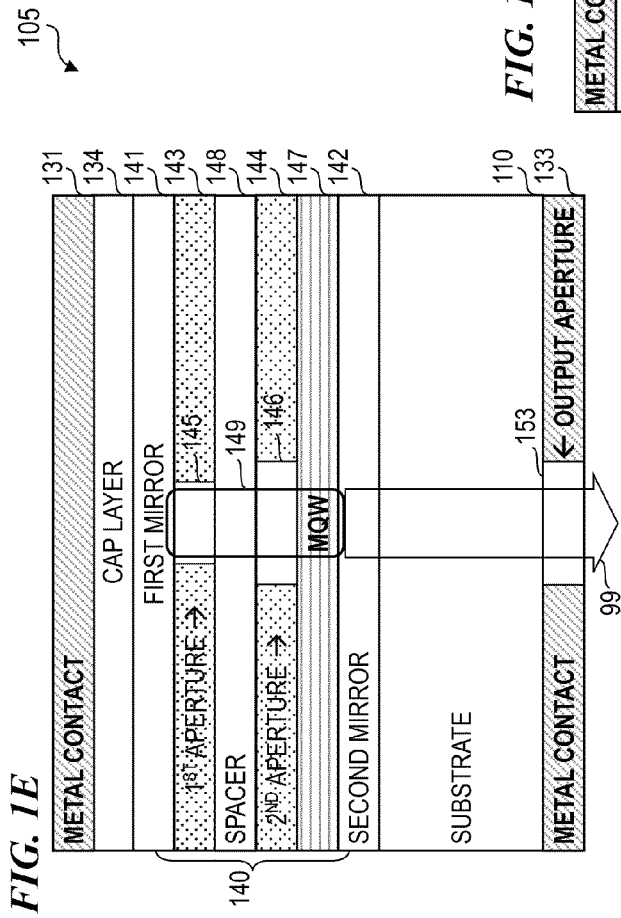
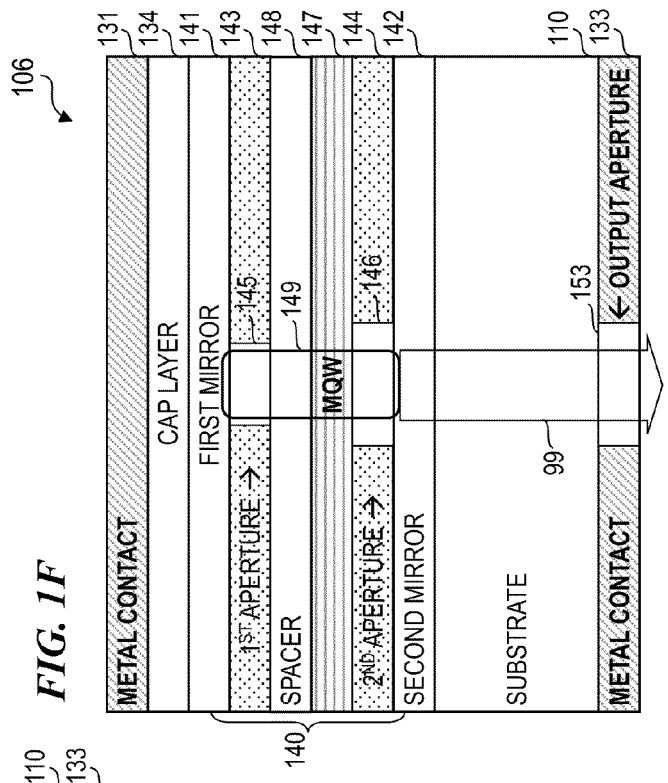
FIG. 1E
FIG. 1F

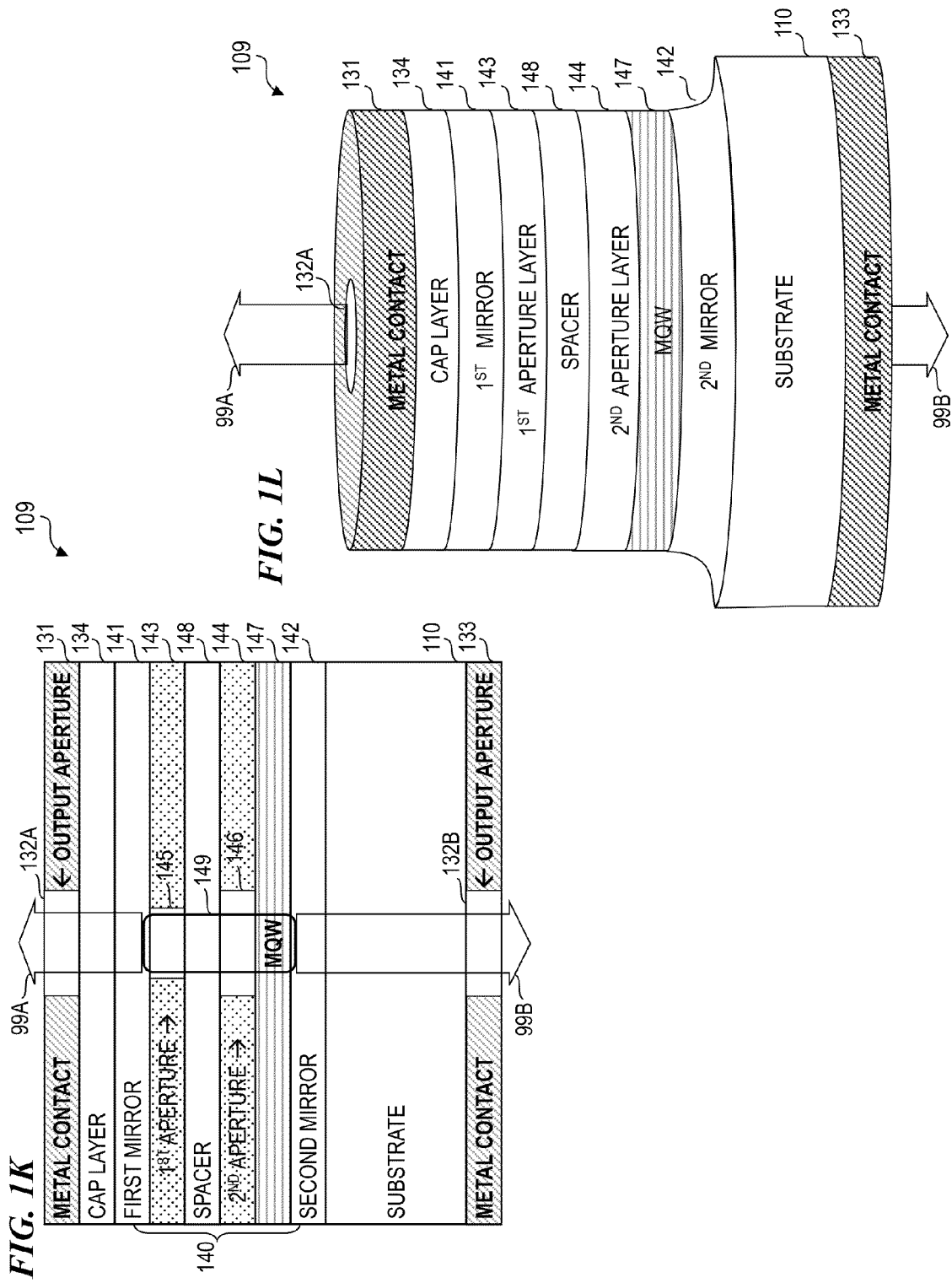

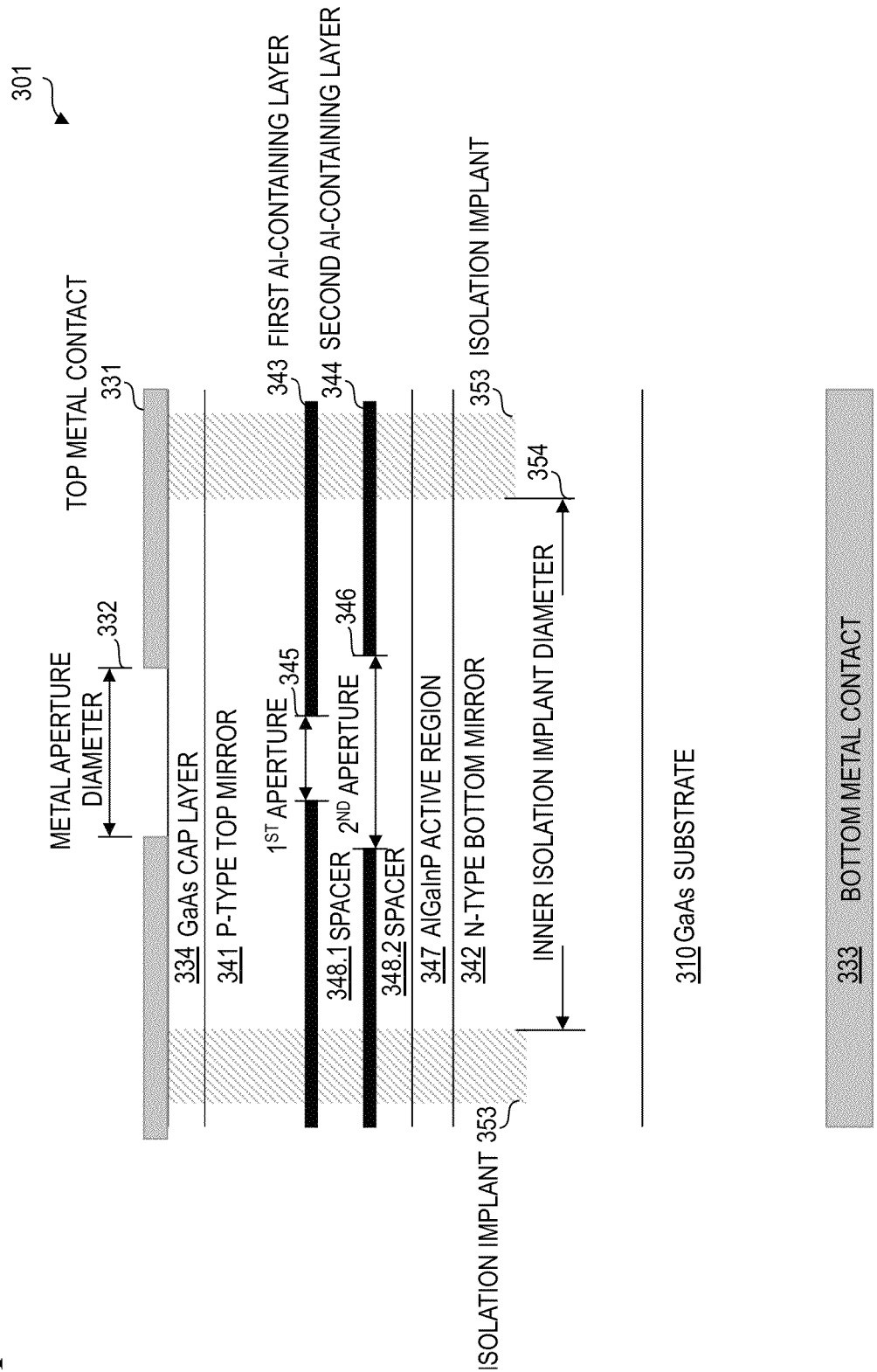

| Name | $D_{ap}$ (µm) | $D_{mirror}$ (µm) |
|---|---|---|
| S05X | 5 | 25 |
| S08X | 8 | 28 |
| S10X | 10 | 30 |
| S12X | 12 | 32 |
| S15X | 15 | 35 |
| S20X | 20 | 40 |
| S25X | 25 | 45 |
| S30X | 30 | 50 |
| S35X | 35 | 55 |
| S50X | 50 | 70 |
| S75X | 75 | 95 |

| Type (X=?) | Contact offset | Isolation offset |
|---|---|---|
| 'A' | 2 | 8 |
| 'B' | 5 | 5 |
| 'C' | 5 | 10 |
| 'D' | 8 | 10 |

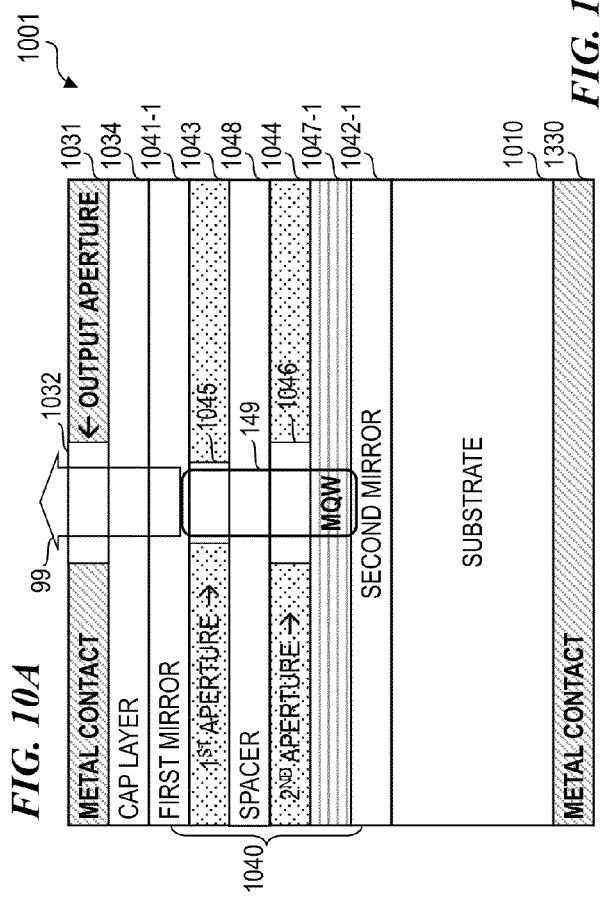
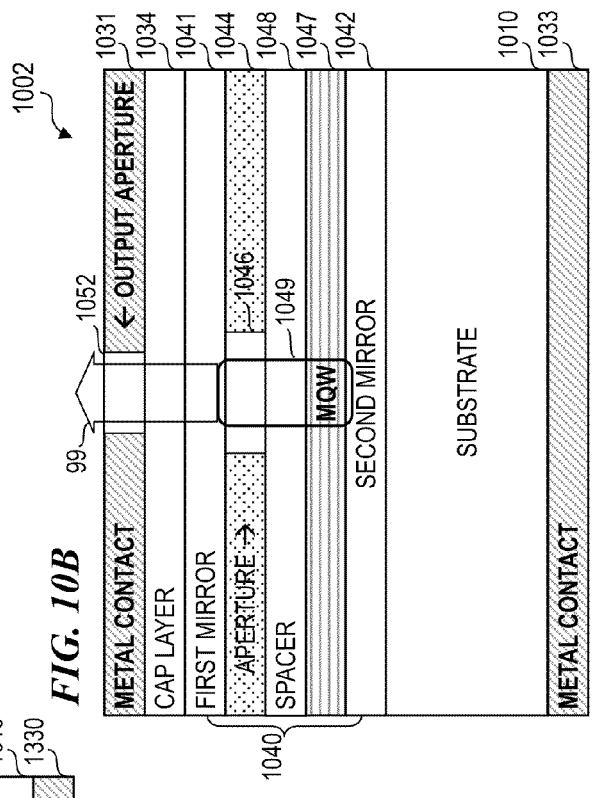

FIG. 11A1  1101  Double Oxide VCSEL Structure

| Layer | | Layer Name | Material | Mole Fraction | Target Thickness (nm) @ Center for 685nm VCSEL | Type | Dopant | Notes |
|---|---|---|---|---|---|---|---|---|
| 56 | | Cap | GaAs | | 12 | P | C, Zn or other p-dopant | Carbon preferred |
| 55 | | Spreader | Al(x)Ga(1-x)As | x=0.4 to 0.6 | 229.18 | P | C, Zn or other p-dopant | Mole fraction 0.45 preferred |
| 53 | | Grade | Al(x)Ga(1-x)As | graded | 10 | P | C, Zn or other p-dopant | |
| 52 | | Doping ramp | Al(x)Ga(1-x)As | x=0.85 to 0.95 | 3 | P | C, Zn or other p-dopant | Mole fraction 0.92 preferred |
| 51 | | Lo Index | Al(x)Ga(1-x)As | x=0.85 to 0.95 | 41.32 | P | C, Zn or other p-dopant | |
| 50 | x20 | Grade | Al(x)Ga(1-x)As | graded | 10 | P | C, Zn or other p-dopant | |
| 49 | | Hi Index | Al(x)Ga(1-x)As | x=0.4 to 0.6 | 39.94 | P | C, Zn or other p-dopant | |
| 48 | | Grade | Al(x)Ga(1-x)As | graded | 10 | P | C, Zn or other p-dopant | |
| 47 | | Oxidation | Al(x)Ga(1-x)As | x=0.96 to 1.00* | 33 | P | C, Zn or other p-dopant | * Critical composition(+.5/-.0) |
| 46 | | Grade | Al(x)Ga(1-x)As | graded | 5 | P | C, Zn or other p-dopant | |
| 45 | | OxStop | Al(x)Ga(1-x)As | x=0.65 | 11.19 | P | C, Zn or other p-dopant | |
| 44 | | Grade | Al(x)Ga(1-x)As | graded | 5 | P | C, Zn or other p-dopant | |
| 43 | | Hi Index | Al(x)Ga(1-x)As | x=0.4 to 0.6 | 39.94 | P | C, Zn or other p-dopant | |
| 42 | | Grade | Al(x)Ga(1-x)As | graded | 10 | P | C, Zn or other p-dopant | |
| 41 | | Doping Ramp | Al(x)Ga(1-x)As | x=0.85 to 0.95 | 3 | P | C, Zn or other p-dopant | |
| 40 | | Lo Index | Al(x)Ga(1-x)As | x=0.85 to 0.95 | 41.32 | P | C, Zn or other p-dopant | |
| 39 | x8 | Grade | Al(x)Ga(1-x)As | graded | 10 | P | C, Zn or other p-dopant | |
| 38 | | Hi Index | Al(x)Ga(1-x)As | x=0.4 to 0.6 | 39.94 | P | C, Zn or other p-dopant | |
| 37 | | Grade | Al(x)Ga(1-x)As | graded | 10 | P | C, Zn or other p-dopant | |

FIG. 11A2  1101

Double Oxide VCSEL Structure

| # | | Material | Composition | | p | Dopant | Strain |
|---|---|---|---|---|---|---|---|
| 36 | Oxidation | Al(x)Ga(1-x)As | x=0.96 to 1.00* | 30 | p | C, Zn or other p-dopant | *Critical composition(+.5/-.0) |
| 35 | Grade | Al(x)Ga(1-x)As | graded | 5 | p | C, Zn or other p-dopant | |
| 34 | OxStop | Al(x)Ga(1-x)As | x=0.65 | 14 | p | C, Zn or other p-dopant | |
| 33 | Grade | Al(x)Ga(1-x)As | graded | 5 | p | C, Zn or other p-dopant | |
| 32 | Hi Index | Al(x)Ga(1-x)As | x=0.4 to 0.6 | 39.94 | p | C, Zn or other p-dopant | |
| 31 | Grade | Al(x)Ga(1-x)As | graded | 10 | p | C, Zn or other p-dopant | |
| 30 | Doping ramp | Al(x)Ga(1-x)As | x=0.85 to 0.95 | 3 | p | C, Zn or other p-dopant | |
| 29 | Lo Index | Al(x)Ga(1-x)As | x=0.85 to 0.95 | 41.32 | p | C, Zn or other p-dopant | |
| 28 | grade | [Al(x)Ga(1-x)]In(1-y)P | x=0.7-->0.4, y=0.5 | 10 | p | Zn | lattice matched |
| 27 | Spacer | [Al(x)Ga(1-x)]In(1-y)P | x=0.7, y=0.5 | 15 | p | Zn | lattice matched |
| 26 | Tensile Strained Barrier | [Al(x)Ga(1-x)]In(1-y)P | x=0.7, y=0.65 | 12 | p | Zn | 1% tensile strain |
| 25 | FP adj Spacer | [Al(x)Ga(1-x)]In(1-y)P | x=0.7, y=0.5 | 3 | p | Zn | lattice matched |
| 24 | Separate Confinement Heterostructure | [Al(x)Ga(1-x)]In(1-y)P | x=0.59-->0.7, y=0.5 | 20 | p | | lattice matched |
| 23 | Separate Confinement Heterostructure | [Al(x)Ga(1-x)]In(1-y)P | x=0.50-->0.59, y=0.5 | 15 | p | | lattice matched |
| 22 | Separate Confinement Heterostructure | [Al(x)Ga(1-x)]In(1-y)P | x=0.5, y=0.5 | 20 | p | | lattice matched |
| 21 | Quantum well | Ga(y)In(1-y)P | y=0.44 | 6 | uid | | 0.5% compressive strain |
| 20 | Barrier | [Al(x)Ga(1-x)]In(1-y)P | x=0.5, y=0.5 | 6 | uid | | lattice matched |
| 19 | Quantum well | Ga(y)In(1-y)P | y=0.44 | 6 | uid | | 0.5% compressive strain |
| 18 | Barrier | [Al(x)Ga(1-x)]In(1-y)P | x=0.5, y=0.5 | 6 | uid | | lattice matched |
| 17 | Quantum well | Ga(y)In(1-y)P | y=0.44 | 6 | uid | | 0.5% compressive strain |

FIG. 11A3 1101

Double Oxide VCSEL Structure

| # | Layer | Material | Composition | Thickness | Doping | Notes |
|---|---|---|---|---|---|---|
| 16 | Separate Confinement Heterostructure | [Al(x)Ga(1-x)]yIn(1-y)P | x=0.5, y=0.5 | 20 | | lattice matched |
| 15 (FP adj) | Separate Confinement Heterostructure | [Al(x)Ga(1-x)]yIn(1-y)P | x=0.7→0.50, y=0.5 | 35 | uid | lattice matched |
| 14 | Spacer | [Al(x)Ga(1-x)]yIn(1-y)P | x=0.7, y=0.5 | 30 | N | Si, Te or other n-type dopant | lattice matched |
| 13 | grade | [Al(x)Ga(1-x)]yIn(1-y)P | x=0.4→0.7, y=0.5 | 10 | N | Si, Te or other n-type dopant | lattice matched |
| 12 | Lo Index | Al(x)Ga(1-x)As | x=0.85 to 0.95 | 44.32 | N | Si, Te or other n-type dopant |
| 11 (x8) | Grade | Al(x)Ga(1-x)As | graded | 10 | N | Si, Te or other n-type dopant |
| 10 | Hi Index | Al(x)Ga(1-x)As | x=0.4 to 0.6 | 39.94 | N | Si, Te or other n-type dopant |
| 9 | Grade | Al(x)Ga(1-x)As | graded | 10 | N | Si, Te or other n-type dopant |
| 8 | Lo index | Al(x)Ga(1-x)As | x=0.85 to 0.95 | 44.32 | N | Si, Te or other n-type dopant |
| 7 (x48) | Grade | Al(x)Ga(1-x)As | graded | 10 | N | Si, Te or other n-type dopant |
| 6 | Hi Index | Al(x)Ga(1-x)As | x=0.4 to 0.6 | 39.94 | N | Si, Te or other n-type dopant |
| 5 | Grade | Al(x)Ga(1-x)As | graded | 10 | N | Si, Te or other n-type dopant |
| 4 | Lo index | Al(x)Ga(1-x)As | x=0.85 to 0.95 | 41.32 | N | Si, Te or other n-type dopant |
| 3 | Doping Ramp | Al(x)Ga(1-x)As | x=0.85 to 0.95 | 3 | N | Si, Te or other n-type dopant |
| 2 | Grade | Al(x)Ga(1-x)As | graded | 10 | N | Si, Te or other n-type dopant |
| 1 | Buffer | GaAs | | 100 | N | Si, Te or other n-type dopant | silicon preferred |
| 0 | Substrate | GaAs | | | N | | 0 - 25 degree off axis substrate (10 ) |

FIG. 11B1

720nm VCSEL structure 1102

| Layer | Layer name | Material | Composition | Thickness (optical) | Thickness (Physical) (nm) | Refractive Indx | Dopant type | Dopant (element) | Dopant Concentration (cm-3) | |
|---|---|---|---|---|---|---|---|---|---|---|
| 38 | Cap | GaAs | x=0 | 0.0624 | 12 | 3.743 | p | C | 3.00E+19 | |
| 37 | Spreader | $Al_xGa_{1-x}As$ | x=0.35 to 0.5 | 0.9603 | 198.99 | 3.475 | p | C | 5.00E+18 | Composition x=0.38 preferred |
| 36 | Hi Index | $Al_xGa_{1-x}As$ | x=0.35 to 0.5 | 0.2046 | 42.4 | 3.475 | p | C | 2.00E+18 | |
| 35 | Grade | $Al_xGa_{1-x}As$ | graded | 0.0454 | 10 | 3.270 | p | C | 2.00E+18 | |
| 34 | Lo Index | $Al_xGa_{1-x}As$ | x=0.85 to 0.95 | 0.2046 | 47.55 | 3.098 | p | C | 2.00E+18 | Composition x=0.92 preferred |
| 33 | Grade | $Al_xGa_{1-x}As$ | graded | 0.0454 | 10 | 3.270 | p | C | 2.00E+18 | |
| 32 | Hi Index | $Al_xGa_{1-x}As$ | x=0.35 to 0.5 | 0.2046 | 42.4 | 3.475 | p | C | 2.00E+18 | |
| 31 | Grade | $Al_xGa_{1-x}As$ | graded | 0.0454 | 10 | 3.270 | p | C | 2.00E+18 | |
| 30 | Oxidation | $Al_xGa_{1-x}As$ | x=0.96 to 1.00 | 0.1276 | 30 | 3.062 | p | C | 2.00E+18 | |
| 29 | Grade | $Al_xGa_{1-x}As$ | graded | 0.0213 | 5 | 3.072 | p | C | 1.00E+18 | |
| 28 | Oxstop | $Al_xGa_{1-x}As$ | x=0.65 | 0.0779 | 17.14 | 3.271 | p | C | 1.00E+18 | |
| 27 | Grade | $Al_xGa_{1-x}As$ | graded | 0.0232 | 5 | 3.341 | p | C | 1.00E+18 | |
| 26 | Hi Index | $Al_xGa_{1-x}As$ | x=0.35 to 0.5 | 0.2046 | 42.4 | 3.475 | p | C | 1.00E+18 | |
| 25 | Grade | $Al_xGa_{1-x}As$ | graded | 0.0454 | 10 | 3.270 | p | C | 1.00E+18 | |
| 24 | Lo Index | $Al_xGa_{1-x}As$ | x=0.85 to 0.95 | 0.2046 | 47.55 | 3.098 | p | C | 1.00E+18 | |
| 23 | Grade | $[Al_xGa_{1-x}]_yIn_{1-y}P$ | x=0.7->0.4, y=0.5 | 0.0448 | 10 | 3.223 | p | Zn | 7.00E+17 | |
| 22 | Spacer | $[Al_xGa_{1-x}]_yIn_{1-y}P$ | x=0.7, y=0.5 | 0.1567 | 36.69 | 3.194 | p | Zn | 7.00E+17 | |
| 21 | Separate Confinement Heterostructure | $[Al_xGa_{1-x}]_yIn_{1-y}P$ | x=0.5->0.7, y=0.5 | 0.0902 | 35 | 3.223 | | uid | | |
| 20 | Separate Confinement Heterostructure | $[Al_xGa_{1-x}]_yIn_{1-y}P$ | x=0.5, y=0.5 | 0.0902 | 20 | 3.246 | | uid | | |

Note: layer 26X bracket spans layers 34–31.

FIG. 11B2

720nm VCSEL structure  1102

| # | Layer | Material | Composition | | | Index | Type | Dopant | Doping | Notes |
|---|---|---|---|---|---|---|---|---|---|---|
| 19 | Quantum Well | Ga(y)In(1-y)P | y=0.42 | 0.0275 | 7 | 3.304 | | uid | | |
| 18 | Barrier | [Al(x)Ga(1-x)]In(1-y)P | x=0.5, y=0.5 | 0.0271 | 6 | 3.246 | | uid | | Could be y=0.4 to y=0.5, 0.42 preferred |
| 17 | Quantum Well | Ga(y)In(1-y)P | y=0.42 | 0.0275 | 7 | 3.304 | | uid | | |
| 16 | Barrier | [Al(x)Ga(1-x)]In(1-y)P | x=0.5, y=0.5 | 0.0271 | 6 | 3.246 | | uid | | Could be y=0.4 to y=0.5, 0.42 preferred |
| 15 | Quantum Well | Ga(y)In(1-y)P | y=0.42 | 0.0275 | 7 | 3.304 | | uid | | |
| 14 | Separate Confinement Heterostructure | [Al(x)Ga(1-x)]In(1-y)P | x=0.5, y=0.5 | 0.0902 | 20 | 3.246 | | uid | | Could be y=0.4 to y=0.5, 0.42 preferred |
| 13 | Separate Confinement Heterostructure | [Al(x)Ga(1-x)]In(1-y)P | x=0.7->0.5, y=0.5 | 0.1567 | 35 | 3.223 | | | | |
| 12 | Spacer | [Al(x)Ga(1-x)]In(1-y)P | x=0.7, y=0.5 | 0.1628 | 36.69 | 3.194 | n | | 5.00E+17 | |
| 11 | Grade | [Al(x)Ga(1-x)]In(1-y)P | x=0.4->0.7, y=0.5 | 0.0448 | 10 | 3.223 | n | | 5.00E+17 | |
| 10 | Lo Index | Al(x)Ga(1-x)As | x=0.85 to 0.95 | 0.2046 | 47.55 | 3.098 | n | Si | 1.00E+18 | |
| 9 | Grade | Al(x)Ga(1-x)As | graded | 0.0454 | 10 | 3.270 | n | Si | 1.00E+18 | |
| 8 | Hi Index | Al(x)Ga(1-x)As | x=0.35 to 0.5 | 0.2046 | 42.4 | 3.475 | n | Si | 1.00E+18 | 6X |
| 7 | Grade | Al(x)Ga(1-x)As | graded | 0.0454 | 10 | 3.270 | n | Si | 1.00E+18 | |
| 6 | Lo Index | Al(x)Ga(1-x)As | x=0.85 to 0.95 | 0.2046 | 47.55 | 3.098 | n | Si | 1.00E+18 | |
| 5 | Grade | Al(x)Ga(1-x)As | graded | 0.0454 | 10 | 3.270 | n | Si | 2.00E+18 | |
| 4 | Hi Index | Al(x)Ga(1-x)As | x=0.35 to 0.5 | 0.2046 | 42.4 | 3.475 | n | Si | 2.00E+18 | 35X |
| 3 | Grade | Al(x)Ga(1-x)As | graded | 0.0454 | 10 | 3.270 | n | Si | 2.00E+18 | |
| 2 | Lo Index | Al(x)Ga(1-x)As | x=0.85 to 0.95 | 0.2046 | 47.55 | 3.098 | n | Si | 2.00E+18 | |
| 1 | Grade | Al(x)Ga(1-x)As | graded | 0.0483 | 10 | 3.475 | n | Si | 2.00E+18 | |
| 0 | Buffer | GaAs | 0 | 0.5199 | 100 | 3.743 | | | | |
| Substrate | | GaAs | 0 | | | | | | | |

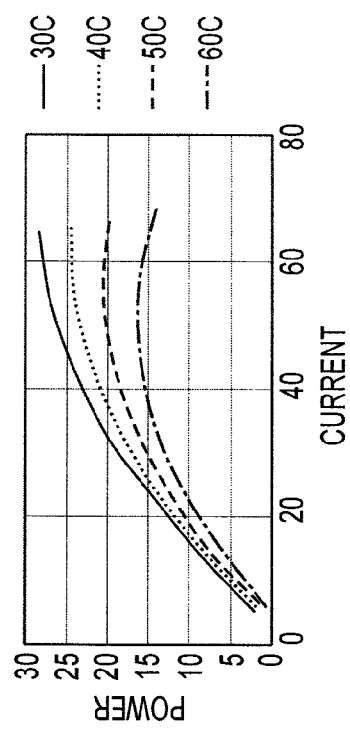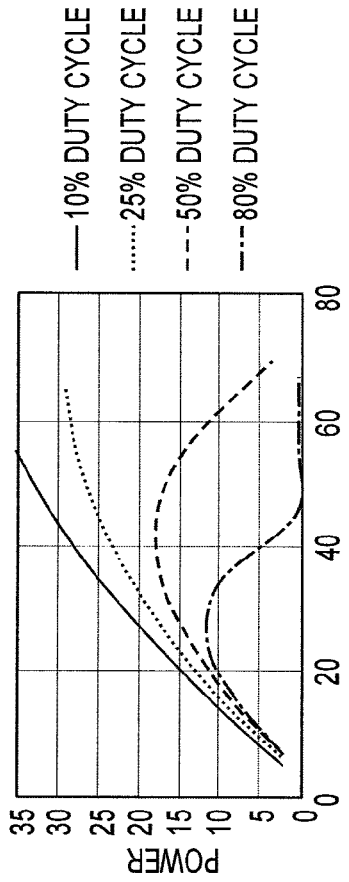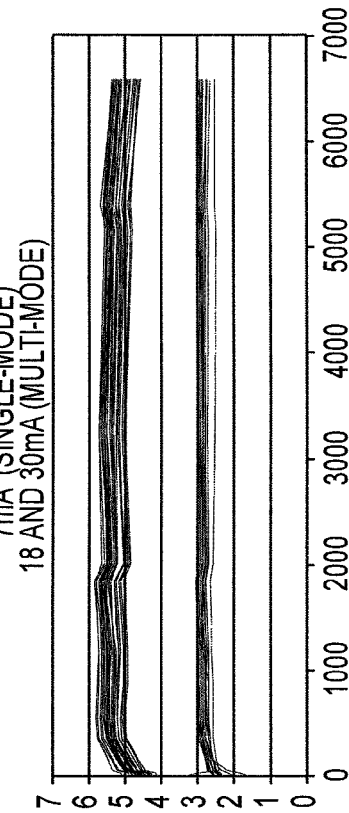
Fig. 17B
Fig. 17A
Fig. 18

METHOD AND APPARATUS INCLUDING IMPROVED VERTICAL-CAVITY SURFACE-EMITTING LASERS

CROSS-REFERENCE TO RELATED APPLICATIONS

This application claims priority to U.S. Provisional Patent Application No. 61/512,333, filed Jul. 27, 2011, and U.S. Provisional Patent Application No. 61/581,594, filed Dec. 29, 2011, and is related to:

U.S. Pat. No. 7,359,421 by Mary K. Brenner, et al. issued Apr. 15, 2008, titled "RED LIGHT LASER,"

U.S. Pat. No. RE41,738 by Mary K. Brenner, et al. issued Sep. 21, 2010, titled "RED LIGHT LASER," and United States Published Patent Application 2010/0220758 by Mary K. Hibbs-Brenner, et al. published Sep. 2, 2010, titled "DIRECT MODULATED MODIFIED VERTICAL CAVITY SURFACE EMITTING LASERS,"

each of which is incorporated herein in its entirety by reference, including the Appendices of U.S. Provisional Patent Application No. 61/512,333, identified as Appendix A by Johnson et al. (citation: Klein Johnson, Mary Hibbs-Brenner, William Hogan, Matthew Dummer, Kabir Dogubo and Garrett Berg, "Record high temperature high output power red VCSELs", Proc. SPIE 7952, 795208 (2011); doi:10.1117/12.876220) and the related Appendix B (a slide presentation presented at the Vertical-Cavity Surface-Emitting Lasers XV SPIE Conference held in San Francisco, Calif. on Wednesday, Jan. 26, 2011).

FIELD OF THE INVENTION

The invention relates generally to laser systems, and more particularly to improved devices, systems, and fabrication methods for vertical-cavity surface-emitting lasers (VCSELs), including those emitting wavelengths in the visible red spectrum (e.g., in some embodiments, in a range of about 600-700 nm), those having hybrid mirrors and those emitting near-infrared light (e.g., in some embodiments, about 720 nm).

BACKGROUND OF THE INVENTION

Multi-mode 850-nm VCSELs based upon the AlGaAs materials system have been the standard optical source for application to glass optical-fiber-based data communication links. However, the implementation of VCSELs for other applications frequently requires different wavelengths and performance attributes than those for which the 850-nm multi-mode VCSELs have been optimized.

As a first example, a very important optically based non-invasive medical-sensor application is oximetry. Pulse oximetry is well-established, and tissue or regional oximetry is an emerging application. Both of these versions of oximetry take advantage of the varying absorption coefficient as a function of wavelength for different types of hemoglobins, (i.e., oxyhemoglobin, reduced hemoglobin, carboxyhemoglobin, or methemoglobin). The sensors rely on the absorption of wavelengths in the regime from about 660 nm to 1000 nm, and as the number of hemoglobin types that are to be analyzed increases, the number of different wavelengths that are required also increases. These applications benefit from the narrow spectral linewidth and the slow spectral shift with temperature of the VCSEL, while wireless implementations benefit from the reduced power consumption of VCSELs as compared to light emitting diodes (LEDs). However, to be commercially viable, VCSEL wavelengths spanning the range from red to near-infrared are required, and in particular, red wavelengths are an important aspect of these systems.

A second example application is plastic optical-fiber links based on poly(methyl methacrylate) (PMMA) fiber materials that have been implemented for sensor and data links in automobiles, and are currently being considered for use in home networks. In some embodiments, PMMA-based fiber has a primary-absorption minimum in the green-wavelength region, and a secondary absorption minimum in the red-wavelength region. Absorption at 850 nm is too high to be practical for typical plastic fiber links having lengths of more than just a few meters.

There is a need for improved laser systems, and in particular, there is a need for VCSELs having improved device characteristics, improved manufacturability, expanded wavelength coverage, improved performance, improved reliability, and improved performance, and additional packaging techniques in order to provide commercially viable devices, products, and systems.

SUMMARY OF THE INVENTION

In some embodiments, the present invention provides a method that includes providing a substrate; forming a VCSEL on the substrate, forming a second mirror on the substrate, depositing a first layered semiconductor structure on the second mirror, wherein the first layered semiconductor structure includes at least a first aluminum-containing layer, a second aluminum-containing layer and a multiple-quantum-well (MQW) structure, depositing a first mirror on the first layered semiconductor structure, depositing an electrical contact on the first mirror, exposing edges of the first layered semiconductor structure 140, and laterally oxidizing the first aluminum-containing layer and the second aluminum-containing layer from the edges while leaving an electrically conductive first aperture in the first aluminum-containing layer and an electrically conductive second aperture in the second aluminum-containing layer.

In some embodiments, the present invention provides an apparatus that includes a semiconductor substrate; a vertical-cavity surface-emitting laser (VCSEL) formed on the substrate; a first electrical contact formed on the VCSEL; a second electrical contact formed on the substrate, and configured such that electrical current that flows between the first electrical contact and the second electrical contact provides pump energy to the VCSEL. In some embodiments, the VCSEL includes: a first resonating cavity, the resonating cavity having a first mirror at a light-emitting end of the resonating cavity and a second mirror, wherein at least one of the first mirror and the second mirror partially transmits and partially reflects light incident on that mirror, wherein the first mirror and the second mirror are electrically conductive; a first layer located between the first mirror and the second mirror, wherein the first layer has a first aperture that restricts the current to pass primarily through the first aperture; and a second layer located between the first layer and the second mirror, wherein the second layer has a second aperture that guides optical mode of laser light; and a multiple-quantum-well (MQW) structure located between the first mirror and the second mirror, wherein the first and second apertures act together to define a path geometry of the current through the MQW structure.

BRIEF DESCRIPTION OF THE DRAWINGS

FIG. 1A is a cross-sectional schematic of a VCSEL device 101, according to some embodiments of the present invention.

FIG. 1B1 is a cross-sectional schematic of a VCSEL device 102-1, according to some embodiments of the present invention.

FIG. 1B2 is a cross-sectional schematic of a VCSEL device 102-2, according to some embodiments of the present invention.

FIG. 1B3 is a cross-sectional schematic of a VCSEL device 102-3, according to some embodiments of the present invention.

FIG. 1B4 is a cross-sectional schematic of a VCSEL device 102-4, according to some embodiments of the present invention.

FIG. 1C1 is a cross-sectional schematic of a VCSEL device 103-1, according to some embodiments of the present invention.

FIG. 1C2 is a cross-sectional schematic of a VCSEL device 103-2, according to some embodiments of the present invention.

FIG. 1D is a cross-sectional schematic of a VCSEL device 104, according to some embodiments of the present invention.

FIG. 1E is a cross-sectional schematic of a VCSEL device 105, according to some embodiments of the present invention.

FIG. 1F is a cross-sectional schematic of a VCSEL device 106, according to some embodiments of the present invention.

FIG. 1K is a cross-sectional schematic of a VCSEL device 109, according to some embodiments of the present invention.

FIG. 1L is a perspective-view schematic diagram of a VCSEL device 109, according to some embodiments of the present invention.

FIG. 2 is a flow chart of a process 200 used to fabricate device 101 of FIG. 1A, according to some embodiments of the present invention.

FIG. 3A is a cross-sectional schematic of a VCSEL device 301, according to some embodiments of the present invention.

FIG. 6E is Table 605 describing various dimensions of VCSEL device 601, according to some embodiments of the present invention.

FIG. 6F is Table 606 describing various dimensions of VCSEL device 601, according to some embodiments of the present invention.

FIG. 10A is a cross-sectional schematic of a VCSEL device 1001, according to some embodiments of the present invention.

FIG. 10B is a cross-sectional schematic of a VCSEL device 1002, according to some embodiments of the present invention.

FIG. 11A1 is the first part of a table/device structure diagram of a double-oxide VCSEL device structure 1101, according to some embodiments of the present invention.

FIG. 11A2 is the second part of table/device structure diagram 1101, according to some embodiments of the present invention.

FIG. 11A3 is the third part of table/device structure diagram 1101, according to some embodiments of the present invention.

FIG. 11B1 is the first part of a 720 nm VCSEL device structure 1102 shown in table format, according to some embodiments of the present invention.

FIG. 11B2 is the second part of a 720 nm VCSEL device structure 1102 shown in table format, according to some embodiments of the present invention.

FIGS. 12-18 illustrate test results of an example VCSEL devices, according to embodiments of the present disclosure.

DETAILED DESCRIPTION

Figure 1H:
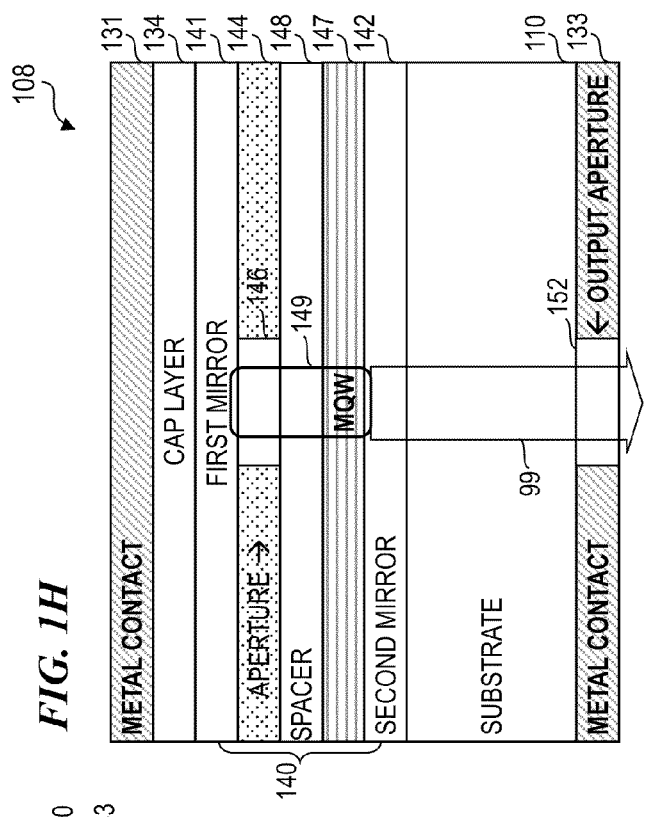
FIG. 1H is a cross-sectional schematic of a VCSEL device 108, according to some embodiments of the present invention.

Although the following detailed description contains many specifics for the purpose of illustration, a person of ordinary skill in the art will appreciate that many variations and alterations to the following details are within the scope of the invention. Accordingly, the following preferred embodiments of the invention are set forth without any loss of generality to, and without imposing limitations upon the claimed invention. Further, in the following detailed description of the preferred embodiments, reference is made to the accompanying drawings that form a part hereof, and in which are shown by way of illustration specific embodiments in which the invention may be practiced. It is understood that other embodiments may be utilized and structural changes may be made without departing from the scope of the present invention.

The leading digit(s) of reference numbers appearing in the Figures generally corresponds to the Figure number in which that component is first introduced, such that the same reference number is used throughout to refer to an identical component that appears in multiple figures. Signals and connections may be referred to by the same reference number or label, and the actual meaning will be clear from its use in the context of the description.

In some embodiments, the present invention provides VCSELs that emit high-quality (e.g., in some embodiments, single-mode) laser light useful for oximetry and/or plastic optical-fiber applications. While the potential for high-speed data rates and the packaging simplicity of VCSELs makes them ideal for this application, wavelengths in the range of about 650 nm to about 680 nm that are made available by the present invention are preferred in some plastic optical-fiber embodiments to provide low-loss links. Furthermore, because these fiber links are intended for the consumer market, a low-cost non-hermetic package made available by the present invention is also desirable.

Additional VCSEL applications, including printing or barcode scanning, benefit from single-spatial-mode devices. Resolution achievable for print is improved by the use of shorter laser wavelengths, and a beam visible to the eye is much preferred for bar-code scanners.

Red VCSELs based upon the AlGaAs/AlGaInP materials system were demonstrated in the early 1990's but have taken significantly longer to commercialize. This commercialization delay can in part be explained by materials issues, such as the limited confinement potentials for quantum-well structures, the small available contrast in refractive index available in the AlGaAs mirrors due to the need to use compositions that are not absorbing at 650 nm to 700 nm, and the higher thermal resistance in the mirrors that results from the more limited composition range available for the mirrors.

Another issue limiting commercialization is the requirement of many non-data communication applications for alternative packaging options. While packaging flexibility is a strength of VCSEL technology, it often presents additional challenges. Traditionally, the 850-nm data-communication VCSEL products are packaged in a hermetic TO-style package. On the other hand, in some embodiments, a disposable medical sensor benefits from the low cost of a plastic surface-mount package that incorporates an organic encapsulant, which may raise questions of humidity resistance and reliability. Similarly, plastic-optical-fiber applications will likely benefit from low-cost non-hermetic packaging. These packaging techniques are used in some embodiments of the present invention.

In the development of single-mode VCSEL devices, short-cavity VCSELs were fabricated in order to eliminate longitudinal modes. However, while the short cavity did eliminate the problem of undesirable longitudinal modes, as is often the case in engineering, one or more other problems arose to take its place. One problem is known as thermal lensing and is thought to be a consequence of charge carriers and photons sharing a common path while traversing the VCSEL device distributed Bragg reflector (DBR) mirrors. Thermal lensing associated with heating of certain zones of the DBRs causes a variable refractive index distribution inside the VCSEL optical cavity and, although this effect often makes VCSEL devices more single mode, causes a degradation of the modulation characteristics (i.e., because the device is heating itself, the heating can cause the device to take an increased time to turn on or turn off).

In order to realize single-transverse-mode VCSEL operation, conventional VCSELs use a single oxide-aperture to both block the unwanted transverse modes and confine the electrical charge carriers. The size of the oxide aperture determines whether the VCSEL will exhibit multiple-mode or single-mode operation, with oxide-aperture diameters of less than about 5 microns typically being required to provide single-mode VCSEL operation. However, single-mode VCSEL devices made this way suffer from reduced emission power, as compared to multiple-mode VCSEL devices, because the smaller oxide aperture limits the amount of charge carriers that combine in the active region.

In some embodiments, the present invention provides VCSEL devices having increased output power, temperature range of operation, achievable wavelength range, and reliability of VCSELs in the red wavelength region, as well as longer wavelength regions. Specifically, some embodiments provide at least about one milliwatt (1 mW) of single-mode power over a temperature range of about 0° C. to about 60° C. Some embodiments provide up to about ten (10) mW of multi-mode power up to about 40° C., and up to about one milliwatt (1 W) or more of useable multi-mode power at 80° C. Some embodiments provide extended performance out to a wavelength of about 720 nm or longer with greater than about one milliwatt (1 mW) of useable output power.

In some embodiments, any of the VCSEL devices of the present invention described herein include "intra-cavity contacts" for providing electrical connection to the VCSEL devices. In some embodiments, the "intra-cavity contacts" include two such contacts that are located within the VCSEL epitaxial structure and wherein the contacts are located on opposite sides of the p-n junction in a multi-quantum-well active region. In some embodiments, "extra-cavity contacts" are used to provide electrical connection and are generally located on opposite ends of the VCSEL device (e.g., in some embodiments, the first "extra-cavity contact is located on the bottom of the substrate and the second "extra-cavity contact" is located on the cap layer on the top surface of the VCSEL device.

Improved Red-Light Laser

In some embodiments, the present invention provides vertical-cavity surface-emitting lasers (VCSELs) and processes for fabricating VCSELs, wherein the VCSELs have a double oxide aperture, wherein the first oxide aperture provides optical confinement and the second oxide aperture provides electrical confinement, and the VCSELs emit laser light having a red wavelength in the range of between about 640 nm and about 700 nm, and in one specific embodiments, having a wavelength of approximately 660 nm.

FIG. 1A is a cross-sectional schematic of a VCSEL device 101, according to some embodiments of the present invention. In some embodiments, VCSEL device 101 includes a semiconductor substrate 110, a vertical-cavity surface-emitting laser (VCSEL) cavity structure 140 formed on the substrate 110, a first electrical contact 131 formed on the VCSEL structure 140, a second electrical contact 133 formed on the substrate 110 on a face (e.g., this is the bottom side as shown in FIG. 1A) opposite the first electrical contact 131. The device 101 is configured such that electrical current flows between the first electrical contact 131 and the second electrical contact 133 in order to provide pump energy to the VCSEL structure 140. In some embodiments, the VCSEL 101 includes a resonating cavity 149, the resonating cavity 149 having a first mirror 141 at a first end of the resonating cavity 149 and a second mirror 142 at an opposite second end of the resonating cavity 149, wherein at least one of the first mirror 141 and the second mirror 142 partially transmits and partially reflects light incident on that mirror, and wherein the first mirror 141 and the second mirror 142 are each made of a material that is electrically conductive.

In some embodiments, the resonating cavity 149 is formed in a first semiconductor layer structure 140, which includes a first layer 143 located between the first mirror 141 and the second mirror 142, wherein the first layer 143 has a first aperture 145 that restricts the current to pass primarily through the first aperture 145. The resonating cavity 149 further includes a second layer 144 located between the first layer 143 and the second mirror 142, wherein the second layer 144 has a second aperture 146 that restricts the electrical current to pass primarily through the second aperture 146. In some embodiments, the first aperture 145 and the second aperture 146 are each centered on an optical axis of the VCSEL 140. In some embodiments, a multiple-quantum-well (MQW) structure 147 is located between the first mirror 141 and the second mirror 142, wherein the first aperture 145 and second aperture 146 act together to define a path geometry of the electrical current through the MQW structure 147 in order to improve reliability and/or efficiency.

In some embodiments, the various layers of VCSEL device 101, including substrate 110, second mirror 142, MQW structure 147, second layer 144, spacer 148, first layer 143, first mirror 141 and cap layer 134, are each formed from one or more crystalline materials, wherein each of the one or more crystalline materials has a lattice constant that is substantially similar to the lattice constant of the substrate 110 in order that, when the various layers are epitaxially grown on the substrate 110, the crystal quality of these layers is of sufficient material quality to form a VCSEL device having good optical and electrical characteristics, as well as good reliability and device lifetime. In some embodiments, spacer 148 includes one or more mirror periods.

In some embodiments, specific features of the layers that form VCSEL device 101, including metal contact 133, substrate 110, second mirror 142, MQW structure 147, second layer 144, spacer 148, first layer 143, first mirror 141, cap layer 134, and metal contact 131 are as described in U.S. Pat. No. 7,359,421 by Mary K. Brenner, et al. issued Apr. 15, 2008, titled "RED LIGHT LASER," and U.S. Pat. No. RE41,738 by Mary K. Brenner, et al. issued Sep. 21, 2010, titled "RED LIGHT LASER," which are both incorporated herein in their entirety by reference. In some embodiments, the other and additional various layers, features, and methods of fabricating the VCSEL devices described herein are also described in these two patents.

Still referring to FIG. 1A, the lasing cavity 140 is defined by a first mirror 141 and a second mirror 142. In some embodiments, each of the mirrors is formed using a distributed Bragg reflector (DBR) mirror structure that includes alternating layers of material, wherein each layer has a different index of refraction than that of its two adjacent neighbor layers. Typically a first index of refraction is used for each of the even-numbered layers and a second index of refraction, different than the first, is used for each of the odd-numbered layers. The thickness of each layer is, e.g., ¼ wavelength of the optical signal to be reflected (the thickness of a pair of layers (i.e., the combined thickness of an even-numbered layer and an odd-numbered layer) in each mirror is often called a period) such that the size of the period is determined by the desired wavelength of the VCSEL device 101 (i.e., in some embodiments, the free-space wavelength of the signal wavelength is between about 640 nm to about 700 nm). Each individual layer has an optical thickness corresponding to one quarter of an optical wavelength ($\lambda/4$), in the material of interest for that layer, for the light intended to be emitted by the VCSEL and a period has an even-numbered layer and an odd-numbered layer each having an optical thickness corresponding to one quarter of an optical wavelength in that material. The optical thickness of each layer is defined by the wavelength of the signal in a vacuum divided by the refractive index of the layer.

For instance, if the emission wavelength is to be 670 nm, and the layer material composition has a refractive index of about 3.5, then the optical thickness corresponding to one wavelength in the material would be (670 nm)/3.5=191.4 nm. Within each mirror 141 and 142, each of the layers is one-quarter wavelength thick, and so each of the mirror layers would be approximately 48 nm thick (wherein these alternating layers have different thicknesses and different material compositions such that each layer has the same quarter-wavelength optical thickness for the wavelength of interest). Thus, each period includes a quarter-wavelength optical thickness of a first material composition and a quarter-wavelength optical thickness of a different material. Many periods (e.g., in some embodiments, 20 or more periods) of alternating quarter-wavelength-thick pairs of layers of these two materials forms a highly reflective mirror at the intended emission wavelength. In some embodiments, all of the layers of one of the mirrors 141 or 142 are doped to be of n-type conductivity, and the layers of the opposite mirror 142 or 141 are doped to be of p-type conductivity. In some embodiments, the output side of the mirror used for light output (e.g., mirror 141 in FIG. 1A) is coated with a highly doped doping-grading layer (not shown) having a thickness of $n\lambda/2$ wherein n is an integer.

In some embodiments, the alternating layers of material in each of the mirrors 141 and 142 include two differing compositions of $Al_xGa_{1-x}As$, for example, in some embodiments, the mirrors 141 and 142 forming the optical resonance cavity are each constructed from AlGaAs materials having different indexes of refraction. For example, in some embodiments, even-numbered thin-film layers having relatively large index of refraction, due to a composition of approximately $Al_{0.5}Ga_{0.5}As$, where the mole fraction of Al is equal to the mole fraction of Ga, are alternated with odd-numbered thin-film layers having a relatively small index of refraction due to a composition of $Al_xGa_{1-x}As$, where the mole fraction x is greater than about 0.85. In other embodiments, even-numbered thin-film layers are formed from AlAs (i.e., x=1) and odd-numbered thin-film layers are formed from $Al_{0.5}Ga_{0.5}As$ (i.e., x=0.5).

In some embodiments, in addition to the wavelength-defining alternating layers of differing indexes of refraction, the first and/or second mirror further include a much thinner graded spacer layer located between at least some of the adjacent alternating layers and formed such that the aluminum and gallium distributions of the spacer layers are monotonically mole-fraction graded over the spacer-layer thickness to match the gallium content in the primary quarter-wave layers on either side of the graded spacer layers. In some such embodiments, one or both of the mirrors include graded spacer layers in combination with each adjacent quarter-wave layers, wherein each spacer layer has a thickness of about 1 nm and the total thickness of the each period is still $\lambda/2$ (i.e., as the thickness of the graded layer increases, the adjacent "quarter-wave" layers decrease to less than $\lambda/4$ in order to keep the total thickness of each period $\lambda/2$). In other embodiments, the spacer layers are between about 1 nm and about 2 nm, or between about 2 nm and about 3 nm, or between about 3 nm and about 4 nm, or between about 4 nm and about 5 nm, or between about 5 nm and about 10 nm, or greater than about 10 nm. In some embodiments, the spacer layers are as described in U.S. Pat. No. RE41,738 by Mary K. Brenner, et al. issued Sep. 21, 2010, titled "RED LIGHT LASER," which is incorporated herein by reference Still referring to FIG. 1A, in some embodiments, VCSEL device 101 includes a plurality of apertures, including a first intracavity aperture 145 and a second intracavity aperture 146. In some embodiments, the device also includes an output aperture 132 formed within one of the electrical contact layers (e.g., layer 131). In some embodiments, the first intracavity aperture 145 has a size that is less than the size of the second intracavity aperture 146, such that the first intracavity aperture 145 provides a relatively weak index-of-refraction guide that confines the transverse optical modes of the cavity (in some embodiments, layer 143 is an oxide that is electrically insulating, which also forces the electrons and/or holes through aperture 145) and the second aperture 146 provides charge-carrier confinement to direct the holes and electrons to a center portion of the MQW structure 147 active region, where, in some embodiments, the charge-confinement aperture 146 is larger than index-guide aperture 145. In some embodiments, the first intracavity aperture 145 is spaced at a non-zero distance from the MQW structure 147, either above or below. That is, in some embodiments, the transverse-mode-confining layer 143 is spaced between approximately four (4) periods and approximately twelve (12) periods (i.e., two to six times the laser-light wavelength in the material within the aperture) from the active layer. In some embodiments, the second intracavity aperture 146 is located a distance from the MQW structure 147, either above or below, that is between approximately zero (0) periods and approximately four (4) periods, wherein (as described above) the thickness of the period is designed to be reflective at the desired wavelength of VCSEL device 101 (i.e., in some embodiments, the desired wavelength of VCSEL between about 640 nm to about 700 nm). The wavelength at which the layers in the DBR mirrors are reflective determines the lasing wavelength of device 101. In some embodiments, the first intracavity aperture 145 and the second intracavity aperture 146 are each formed from an oxide (e.g., from an aluminum-containing layer that has been wet-oxidized from the sides), or are each formed via proton implantation. In other embodiments, only one of the apertures is formed from an oxide, and the other aperture is formed via proton implantation. In other embodiments, any other suitable method (such as, e.g., ionized helium implantation or lithographic masking) for forming the aperture is specifically contemplated.

As described for the various embodiments shown herein, the first intracavity aperture 145 and the second intracavity aperture 146 are located either both on one side of the MQW structure 147, or one of the intracavity apertures is located on one side of the MQW structure 147 and the other intracavity aperture is located on the opposite side the MQW structure 147.

In other embodiments of the present invention, the VCSEL device (such as device 104 of FIG. 1D, device 108 of FIG. 1H) includes only a single intracavity aperture that is adjacent or spaced away from the MQW structure active region by a distance of between about zero periods and about two periods inclusive, or between about two periods and about four periods inclusive, or between about four periods and about six periods inclusive, or between about six periods and about eight periods. In other embodiments, the VCSEL device includes a single intracavity aperture that is located at a distance away from the MQW structure active region of between about zero periods and about two periods, in order to output multiple-mode laser light. In yet other embodiments, the VCSEL device includes a single intracavity aperture that is located at a distance away from the MQW structure active region of between about two periods and about eight periods, in order to output single-mode laser light. In some embodiments, a single intracavity aperture having a conical or pyramidal-shape opening in a thicker Al-containing layer is used (such as device 101A of FIG. 1i or device 107A of FIG. 1J).

FIG. 1B1 is a cross-sectional schematic of a VCSEL device 102-1, according to some embodiments of the present invention. In some embodiments, VCSEL device 102-1 is substantially similar to VCSEL device 101 shown in FIG. 1A and described above, except that the MQW structure 147 of VCSEL device 102-1 is located between the first layer 143 and the second layer 144, as shown in FIG. 1B1 such that the intracavity apertures 145 and 146 are on opposite sides of the MQW structure 147. In this embodiment, spacer layer 148 is located between the smaller intracavity aperture 145 and the MQW structure 147. The second layer 144 and its larger intracavity aperture 146 are located between the MQW structure 147 and the second intracavity mirror 142.

In some embodiments of all of the versions of the present invention, the second intracavity aperture 146 is larger than the transverse mode that passes through intracavity aperture 145 in order to have the holes and electrons in the MQW structure 147 across an area that is wider than the transverse mode in order to reduce edge effects. In other embodiments, intracavity aperture 145 and intracavity 146 are made substantially the same size.

Figure 1G:
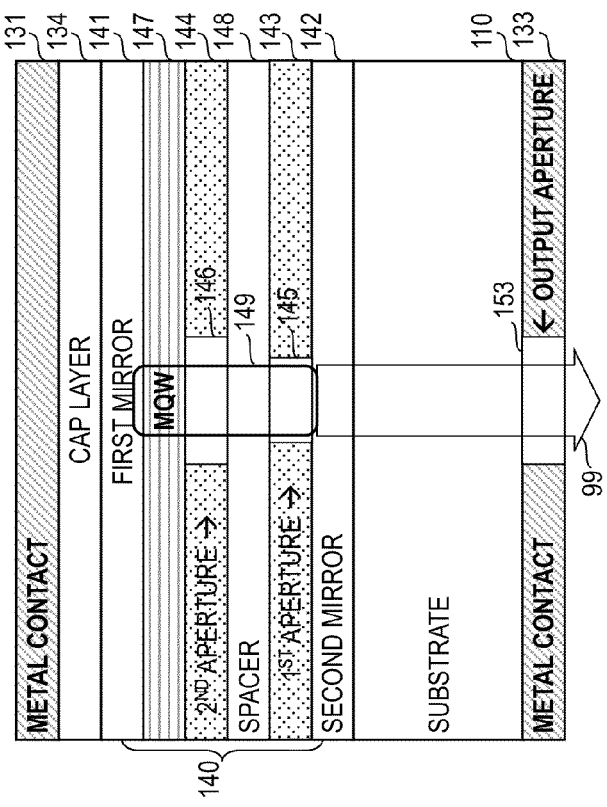
FIG. 1G is a cross-sectional schematic of a VCSEL device 107, according to some embodiments of the present invention.
Figure 1J:
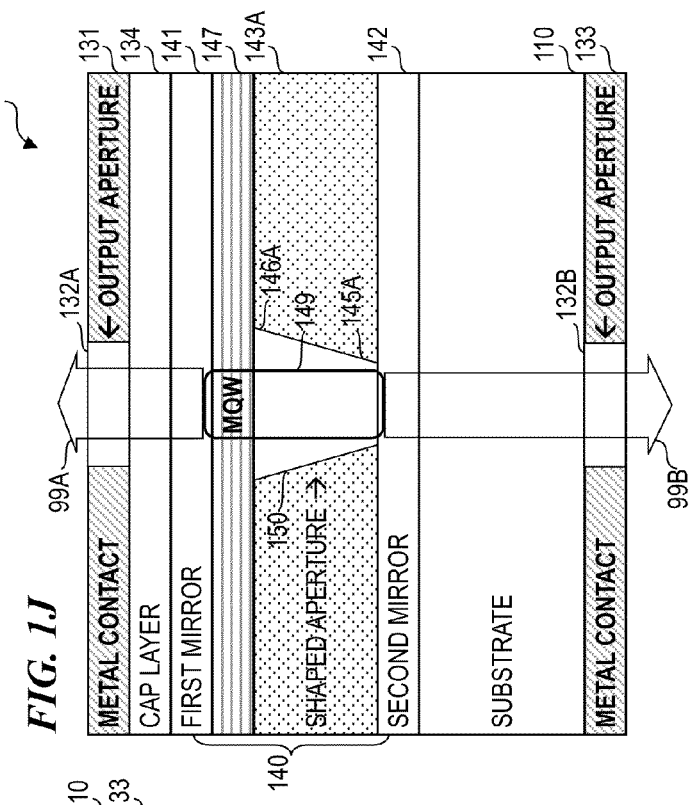
FIG. 1J is a cross-sectional schematic of a VCSEL device 107A, according to some embodiments of the present invention.
Figure 1I:
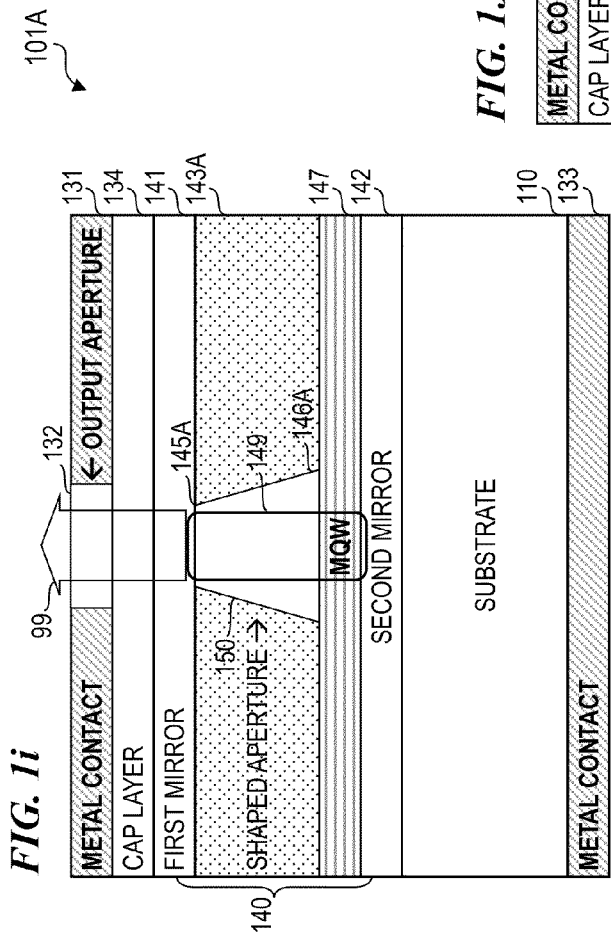
FIG. 1i is a cross-sectional schematic of a VCSEL device 101A, according to some embodiments of the present invention.
Figure 2:
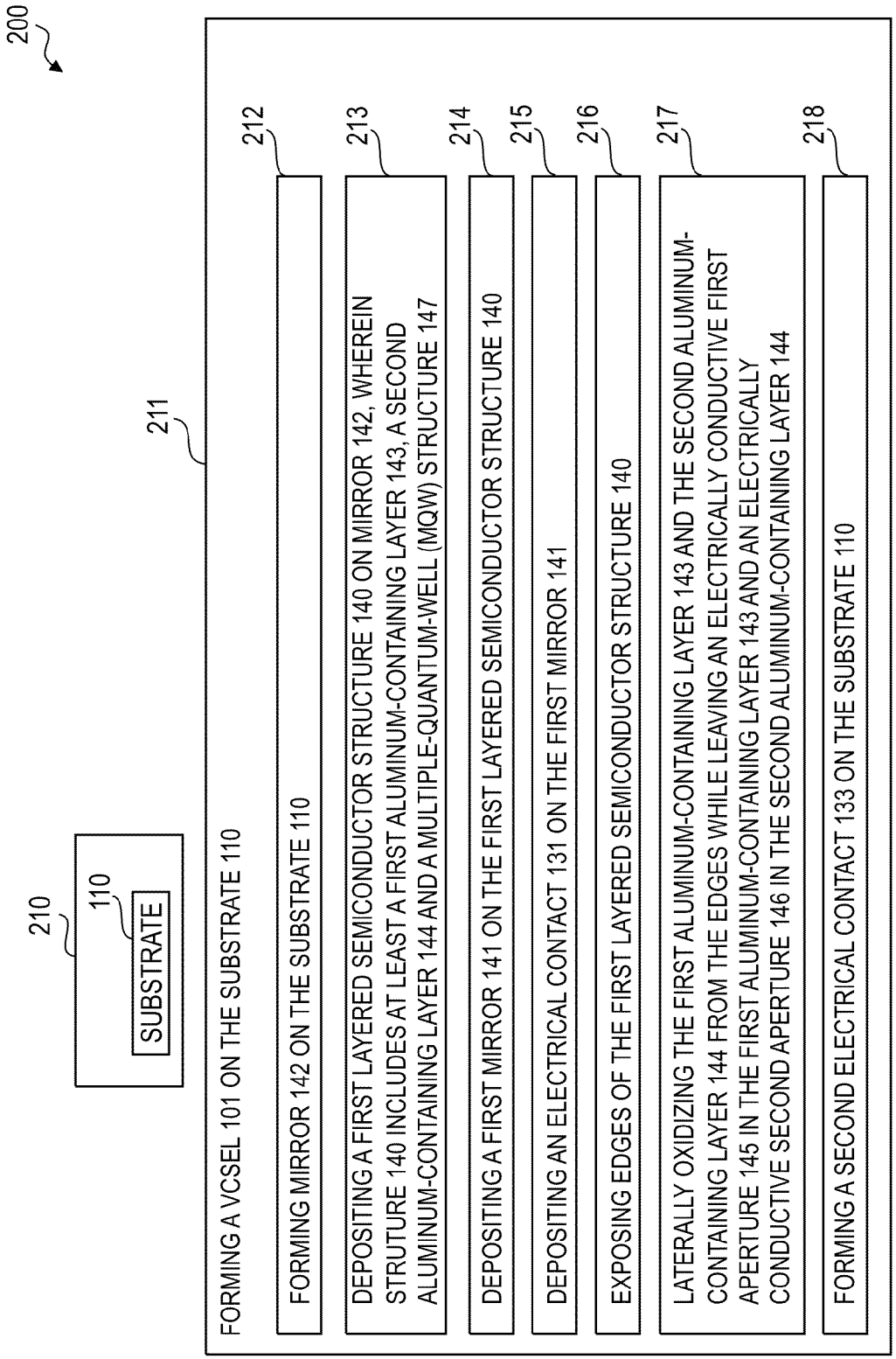

FIG. 1B2 is a cross-sectional schematic of a VCSEL device 102-2, according to some embodiments of the present invention. In some embodiments, VCSEL device 102-2 is substantially similar to VCSEL device 102-1 shown in FIG. 1B1 and described above, except that the second intracavity aperture 146 (the larger of the two apertures) is formed from high-aluminum content portions of the mirror adjacent the MQW structure 147 (in this case intracavity aperture 146 is formed by oxidizing the outer portions of mirror 142 from the edges). Thus the intracavity aperture 146 is merged with mirror 142. In some embodiments, the entire thickness of the second mirror 142 has alternating layers of oxidized material and un-oxidized material, where the oxidation occurs from the edges in order to form this merged aperture-mirror, as shown in FIG. 1B3. In some such embodiments, the material layers in the second mirror 142 structure that oxidize have a material composition that includes greater than 85% aluminum content.

FIG. 1B3 is a cross-sectional schematic of a VCSEL device 102-3, according to some embodiments of the present invention. In some embodiments, VCSEL device 102-3 is substantially similar to VCSEL device 102-1 shown in FIG. 1B1 and described above, except that the first intracavity aperture 145 and the entire upper mirror 141 are merged (i.e., the oxidation of the material layers having a material composition that includes greater than 85% aluminum content from the sides of aperture layer is performed on the DBR mirror 141 material), and the second intracavity aperture 146 (the larger of the two apertures) and the entire bottom DBR mirror 142 are similarly merged.

FIG. 1B4 is a cross-sectional schematic of a VCSEL device 102-4, according to some embodiments of the present invention. In some embodiments, VCSEL device 102-4 is substantially similar to VCSEL device 102-3 shown in FIG. 1 B3 and described above, except that the first intracavity aperture 145 and the second intracavity aperture 146 are substantially the same size. In some embodiments of each of the other figures described herein, the first intracavity aperture 145 and the second intracavity aperture 146 are substantially the same size.

FIG. 1C1 is a cross-sectional schematic of a VCSEL device 103-1, according to some embodiments of the present invention. In some embodiments, VCSEL device 103-1 is substantially similar to VCSEL device 101 shown in FIG. 1A and described above, except that the MQW structure 147 of VCSEL device 103-1 is located further from substrate 110 than the two intracavity apertures (in this embodiment, the MQW structure 147 is above both the first layer 143 and the second layer 144, as shown in FIG. 1C1). In some embodiments, a spacer layer 148 is again provided between the first layer 143 and its intracavity aperture 145, and the second layer 144 and its intracavity aperture 146.

FIG. 1C2 is a cross-sectional schematic of a VCSEL device 103-2, according to some embodiments of the present invention. In some embodiments, VCSEL device 103-2 is substantially similar to VCSEL device 103-1 shown in FIG. 1C1 and described above, except that an additional current-confining aperture 166 is located on opposite face of the MQW structure 147 as the first current-confining aperture 144. In some embodiments, a third layer 164 is substantially similar to layer 144 and is processed in a similar manner used to create aperture 145 in layer 144, in order to form the second current-confining aperture 166.

FIG. 1D is a cross-sectional schematic of a VCSEL device 104, according to some embodiments of the present invention. In some embodiments, VCSEL device 104 is conceptually similar to VCSEL device 101 shown in FIG. 1A and described above, except that VCSEL device 104 includes a single intracavity current-confinement aperture 146 that is used primarily for current confinement, and is the only intracavity aperture integrated within the semiconductor layer structure 140. VCSEL 104 includes output aperture 152 provided in metal contact layer 131, which is used primarily to provide optical confinement in place of small aperture 145 of FIGS. 1A-1C1, which each have two intracavity apertures (in contrast to the single intracavity aperture in this embodiment) in order to control the output mode of VCSEL 104 (e.g., multiple-mode operation or quasi-single-mode output, depending on the whether the aperture is large or small, respectively). In some embodiments, the output aperture 152 has a radius that is greater than the integrated intracavity aperture 146 in order to provide multiple-mode laser output. In other embodiments, the output aperture 152 has a radius that is less than the integrated intracavity aperture 146 in order to block energy in the outside of the beam to provide quasi-single-mode laser operation. In some embodiments, as shown in FIG. 1D, the integrated intracavity aperture 146 is located above MQW structure 147, however, in other embodiments (not shown) the integrated intracavity aperture 146 in located between the MQW structure 147 and the substrate 110, but is still integrated within the semiconductor layer structure 140. In some embodiments, the spacer 148 is omitted (i.e., the spacer 148 has zero thickness).

FIG. 1E is a cross-sectional schematic of a VCSEL device 105, according to some embodiments of the present invention. In some embodiments, VCSEL device 105 is substantially similar to VCSEL device 101 shown in FIG. 1A and described above, except that the output aperture 153 is located on the bottom of substrate 110 in metal contact layer 133, and therefore the laser light 99 of VCSEL 105 is output from the bottom of VCSEL 105. In some embodiments, aperture 153 has a relatively large diameter to permit all of the beam (defined to be single-mode by the small aperture 145). In some such embodiments, the first mirror 141 (opposite the substrate 110) is highly reflecting at the desired laser wavelength and the second mirror 142 (closer to the substrate) is partially reflecting and partially transmitting at the desired laser wavelength (in some embodiments, the desired laser wavelength is in the range of about 650 nm to 700 nm) in order to allow the laser light 99 to be emitted through the bottom of VCSEL 105.

In some embodiments, because the GaAs substrate that is normally used for the epitaxial growth of the VCSEL device structure is not transparent to wavelengths shorter than about 900 nm, VCSEL devices that emit laser light from the bottom of the device require additional steps to allow for the emission of the laser light. In some embodiments, the substrate side of the wafer is patterned with photoresist, and wet or dry chemical etching is used to etch a trench opening that is aligned with the VCSEL aperture and allows the light to pass through. In other embodiments, the entire substrate is be removed and either the wafer can be attached to a submount on the front side, and then the GaAs substrate etched off the back, or the device can be mounted to a temporary carrier on the front, the substrate etched away and then attached to a transparent submount, and then the front side temporary carrier removed. Other methods of providing for emission from the bottom of the VCSEL device is provided in U.S. Pat. No. RE41,738 by Mary K. Brenner, et al. issued Sep. 21, 2010, titled "RED LIGHT LASER" and incorporated by reference herein in its entirety. In some embodiments, transparent but non-conductive substrates are patterned with metal to attach individual VCSEL device chips to.

FIG. 1F is a cross-sectional schematic of a VCSEL device 106, according to some embodiments of the present invention. In some embodiments, VCSEL device 106 is substantially similar to VCSEL device 102-1 shown in FIG. 1B1 and described above, except that the output aperture 152 is located on the bottom of substrate 110 in metal contact layer 133, and therefore the laser light 99 of VCSEL 106 is output from the bottom of VCSEL 106. In some such embodiments, the first mirror 141 is highly reflecting at the desired laser wavelength and the second mirror 142 is partially reflecting and partially transmitting at the desired laser wavelength (in some embodiments, the desired laser wavelength is in the range of about 650 nm to 700 nm) in order to allow the laser light 99 to be emitted through the bottom of VCSEL 106.

FIG. 1G is a cross-sectional schematic of a VCSEL device 107, according to some embodiments of the present invention. In some embodiments, VCSEL device 107 is substantially similar to VCSEL device 103-1 shown in FIG. 1C1 and described above, except that the output aperture 152 is located on the bottom of substrate 110 in metal contact layer 133, and therefore the laser light 99 of VCSEL 107 is output from the bottom of VCSEL 107. In some such embodiments, the first mirror 141 is highly reflecting at the desired laser wavelength and the second mirror 142 is partially reflecting and partially transmitting at the desired laser wavelength (in some embodiments, the desired laser wavelength is in the range of about 650 nm to 700 nm) in order to allow the laser light 99 to be emitted through the bottom of VCSEL 107.

FIG. 1H is a cross-sectional schematic of a VCSEL device 108, according to some embodiments of the present invention. In some embodiments, VCSEL device 108 is substantially similar to VCSEL device 104 shown in FIG. 1D and described above, except that the output aperture 152 is located on the bottom of substrate 110 in metal contact layer 133, and therefore the laser light 99 of VCSEL 108 is output from the bottom of VCSEL 108. In some such embodiments, the first mirror 141 is highly reflecting at the desired laser wavelength and the second mirror 142 is partially reflecting and partially transmitting at the desired laser wavelength (in some embodiments, the desired laser wavelength is in the range of about 650 nm to 700 nm) in order to allow the laser light 99 to escape through the bottom of VCSEL 108.

FIG. 1*i* is a cross-sectional schematic of a VCSEL device 101A, according to some embodiments of the present invention. In some embodiments, VCSEL device 101A is substantially similar to VCSEL device 101 shown in FIG. 1A and described above, except that VCSEL device 101A includes a taper-shaped aperture 150 provided in layer 143A and taper-shaped aperture 150 includes a minimum aperture radius 145A and a maximum aperture radius 146A. In some embodiments, shaped aperture 150 provides the functionality of both the first aperture 145 and the second aperture 146 as shown in FIG. 1A, that is, taper-shaped aperture 150 provides both optical confinement and electrical confinement. In some embodiments, minimum aperture radius 145A provides optical confinement of photons and allows VCSEL 101A to operate in a multiple-mode regime or in a single-mode regime, depending on the size of the minimum aperture radius. In some embodiments, maximum aperture radius 146A provides electrical confinement by directing the charge carriers (i.e., holes and electrons) to a portion of the MQW structure 147 that is slightly larger in lateral diameter than the diameter of the optical cavity region 149 (in order to avoid detrimental edge effects (i.e., the current density is substantially uniform across the diameter of the optical mode of optical cavity region 149 but maximum aperture radius 146A is not excessively large so that not too much hole-electron recombination is wasted outside the laser beam).

In some embodiments, the taper-shaped aperture 150 is achieved by varying the composition of layer 143A (such that the composition of layer 143A oxidizes faster at the small-diameter side and slower at the large-diameter side of aperture 150) in order to attain the desired aperture profile. For example, in some embodiments, layer 143A includes an $Al_xGa_{1-x}As$ layer 143A that has an increasing Al concentration (i.e., the Al concentration of the $Al_xGa_{1-x}As$ layer 143A closest to the MQW structure 147 is less than the Al concentration of the $Al_xGa_{1-x}As$ layer 143A closest to the first mirror 141) such that when the $Al_xGa_{1-x}As$ layer 143A is oxidized, the $Al_xGa_{1-x}As$ material having the higher Al concentration oxidizes faster than the $Al_xGa_{1-x}As$ material that has a lower Al concentration and therefore the $Al_xGa_{1-x}As$ material having the higher Al concentration will have a smaller aperture radius than the $Al_xGa_{1-x}As$ material having the lower Al concentration. The increased thickness of layer 143A (relative to the thickness of layer 143 of the other embodiments) is designed to be of a thickness that results in the desired spacing between the small-diameter end of aperture 150 and the active MQW layer 147. In some embodiments, the Al concentration of the $Al_xGa_{1-x}As$ layer 143A increases linearly across the thickness of the $Al_xGa_{1-x}As$ layer 143A. In other embodiments, the Al concentration of the $Al_xGa_{1-x}As$ layer 143A increases exponentially across the thickness of the $Al_xGa_{1-x}As$ layer 143. In yet other embodiments, the Al concentration of the $Al_xGa_{1-x}As$ layer 143A increases in a step-wise fashion across the thickness of the $Al_xGa_{1-x}As$ layer 143A and has at least a single step increase in Al concentration, and the resulting aperture 150 also has a step-like aperture radius change. In other embodiments, yet other Al concentration profiles are used in order to achieve a specific desired shaped aperture 150.

In other embodiments, the taper of aperture 150 is achieved using a proton implant that uses a taper-angled directional implant, iterative implants using a plurality of masks of different sizes, or other suitable techniques.

FIG. 1J is a cross-sectional schematic of a VCSEL device 107A, according to some embodiments of the present invention. In some embodiments, VCSEL device 107A is substantially similar to VCSEL device 103-1 shown in FIG. 1C1 and described above and VCSEL device 107 shown in FIG. 1G and also described above, except that VCSEL device 107A includes a shaped aperture 150 provided in layer 143A and shaped aperture 150 includes a minimum aperture radius 145A and a maximum aperture radius 146A. In some embodiments, shaped aperture 150 provides the functionality of the both the first aperture 145 and the second aperture 146 as shown in FIG. 1C1 and FIG. 1G, that is, shaped aperture 150 provides both optical confinement and electrical confinement. In some embodiments, minimum aperture radius 145A provides optical confinement of photons and allows VCSEL 107A to operate in a multiple-mode regime or in a single-mode regime, depending on the size of the minimum aperture radius. In some embodiments, maximum aperture radius 146A provides electrical confinement by directing the charge carriers (i.e., holes and electrons) to the optical cavity region 149 of the MQW structure 147. In some embodiments, the shaped aperture 150 is achieved using methods and techniques similar to those described above.

In some embodiments of each of the embodiments shown and described herein, the VCSEL device (e.g., device 107A of FIG. 1J) outputs laser light from both the top of the VCSEL device (e.g., device 107A of FIG. 1J) through output aperture 132A in top metal contact layer 131 and from the bottom of the VCSEL device (e.g., device 107A of FIG. 1J) through output aperture 132B in bottom metal contact layer 133. In some embodiments, both the first mirror 141 and the second mirror 142 are partially reflecting and partially transmitting in order that optical laser light 99A is output from output aperture 132A and optical laser light 99B is output from output aperture 132B. In some embodiments, the total optical power emitted from VCSEL device 107A is determined by the combination of optical power of laser light 99A and laser light 99B. In some such embodiments, VCSEL device 107A allows for two output beams (e.g., laser light 99A and laser light 99B) having different power levels, wherein one of the output beams can be used for the device's primary application (e.g., optical communications, medical therapy, or the like) and the other output beam can be used for diagnostic purposes (e.g., measuring the lasing wavelength, the laser spectrum, beam power or the like).

In some embodiments, the first mirror 141 and the second mirror 142 are designed such that at least 99% of the total optical power emitted by VCSEL device 107A is emitted by one of the mirrors and at most 1% of the total optical power emitted by VCSEL device 107A is emitted by the other mirror. In some embodiments, at least 98% of the total optical power emitted is emitted by one of the mirrors and at most 2% of the total optical power emitted is emitted by the other mirror, or at least 97% of the total optical power emitted is emitted by one of the mirrors and at most 3% of the total optical power emitted is emitted by the other mirror, or at least 96% of the total optical power emitted is emitted by one of the mirrors and at most 4% of the total optical power emitted is emitted by the other mirror, or at least 95% of the total optical power emitted is emitted by one of the mirrors and at most 5% of the total optical power emitted is emitted by the other mirror, or at least 90% of the total optical power emitted is emitted by one of the mirrors and at most 10% of the total optical power emitted is emitted by the other mirror (e.g., if the primary output mirror reflected 99% of the incident light power as feedback into the laser cavity and passed 1% as the main output beam, while the secondary mirror reflected 99.9% as feedback into the laser cavity and transmitted 0.1% as diagnostic output, such that the main output beam had ten times the power of the secondary diagnostic output). In other embodiments, at least 85% of the total optical power emitted is emitted by one of the mirrors and at most 15% of the total optical power emitted is emitted by the other mirror, or at least 80% of the total optical power emitted is emitted by one of the mirrors and at most 20% of the total optical power emitted is emitted by the other mirror, or at least 70% of the total optical power emitted is emitted by one of the mirrors and at most 30% of the total optical power emitted is emitted by the other mirror, or at least 60% of the total optical power emitted is emitted by one of the mirrors and at most 40% of the total optical power emitted is emitted by the other mirror. In still other embodiments, about 50% of the total optical power emitted is emitted by one of the mirrors and about 50% of the total optical power emitted is emitted by the other mirror.

FIG. 1K is a cross-sectional schematic of a VCSEL device 109, and FIG. 1L is a perspective-view schematic diagram of a VCSEL device 109 of FIG. 1K, according to some embodiments of the present invention. In some embodiments, VCSEL device 109 is substantially similar to VCSEL device 101 shown in FIG. 1A and described above, except that VCSEL device 109 includes a first output aperture 132A for emitting laser light 99A and a second output aperture 132B for emitting laser light 99B. In some embodiments, VCSEL device 109 has the similar advantages provided by VCSEL device 107A and described above with respect to outputting two optical laser beams (i.e., 99A and 99B). In some embodiments, the structure shown in FIG. 1L results from a mesa-etch process.

FIG. 2 is a flowchart of a process 200 used to fabricate device 101 of FIG. 1A according to some embodiments of the present invention. In some embodiments, process 200 includes providing 210 the substrate 110, forming 211 a VCSEL 101 on the substrate 110, wherein the forming 211 of the VCSEL 101 includes forming 212 a second mirror 142 on the substrate 110, depositing 213 a first layered semiconductor structure 140 on the second mirror 142. In some embodiments, the first layered semiconductor structure 140 includes at least a first aluminum-containing layer 143, a second aluminum-containing layer 144, and a multiple-quantum-well (MQW) structure 147. In some embodiments, forming 211 further includes depositing 214 a first mirror 141 on the first layered semiconductor structure 140, depositing 215 a first electrical contact 131 on the first mirror 141, exposing 216 edges of the first layered semiconductor structure 140, laterally oxidizing 217 the first aluminum-containing layer 143 and the second aluminum-containing layer 144 from the edges while leaving an electrically conductive first aperture 145 in the first aluminum-containing layer 143 and an electrically conductive second aperture 146 in the second aluminum-containing layer 144, and forming 219 a second electrical contact 133 on the substrate 110.

In some embodiments, process 200 uses standard semiconductor fabrication processing techniques and equipment to fabricate device 101 of FIG. 1A. In some embodiments, a process similar to process 200 is used to fabricate device 102-1 of FIG. 1B1, device 103-1 of FIG. 1C1, device 105 of FIG. 1D, device 105 of FIG. 1E, device 106 of FIG. 1F, device 107 of FIG. 1G, device 108 of FIG. 1H, device 101A of FIG. 1i, device 107A of FIG. 1J, device 109 of FIG. 1K, and device 109 of FIG. 1L except that the order of the specific process steps will be modified according to each specific embodiment.

FIG. 3A is a cross-sectional schematic of a VCSEL device 301, according to some embodiments of the present invention. In some embodiments, VCSEL device 301 is substantially similar to VCSEL device 101 shown in FIG. 1A and described above, except that VCSEL device 301 includes isolation implant 353 and multiple spacer layers 348.1 and 348.2 (each of which might be a single semiconductor layer, or one or more mirror periods). In some embodiments, the isolation implant 353 is used to electrically isolate VCSEL device 301 from other VCSEL devices that are adjacent to VCSEL device 301. In some embodiments, VCSEL device 301 includes a first Al-containing layer 343 that defines a first aperture 345 and a second Al-containing layer 344 that defines a second aperture 346, wherein the diameter of the first aperture 354 is smaller that the diameter of the second aperture 346. In some embodiments, the first Al-containing layer 343 has a thickness that is larger than the thickness of the second Al-containing layer 344, such that when both the first Al-containing layer 343 and the second Al-containing layer 344 are oxidized using a wet oxidation process, the first Al-containing layer 343 oxidizes at a faster rate than the second Al-containing layer 344 in order that the diameter of the first aperture 345 is smaller than the diameter of the second aperture 346. In other embodiments, the first Al-containing layer 343 has an Al concentration that is greater than the Al concentration of the second Al-containing layer 344, such that when both the first Al-containing layer 343 and the second Al-containing layer 344 are oxidized using a wet oxidation process, the first Al-containing layer 343 oxidizes at a faster rate than the second Al-containing layer 344 in order that the diameter of the first aperture 345 is smaller than the diameter of the second aperture 346. In some embodiments, the first Al-containing layer 343 provides optical confinement while the second Al-containing layer 344 provides current confinement in order to achieve a single-mode VCSEL device having a larger aperture (i.e., the second aperture 346) for improved reliability and increased output power. In some embodiments, a top metal contact 331 is provided that has a metal aperture 332 formed therein. In some such embodiments, the metal aperture 332 has a diameter that is larger than the diameter of the second aperture 346 in order to improve power efficiency. In other embodiments, the metal aperture 332 has a diameter that is equal to or smaller than the diameter of the second aperture 346 in order to improve the thermal conductivity of the VCSEL device 301 and/or to provide additional optical mode control.

Figure 3B:
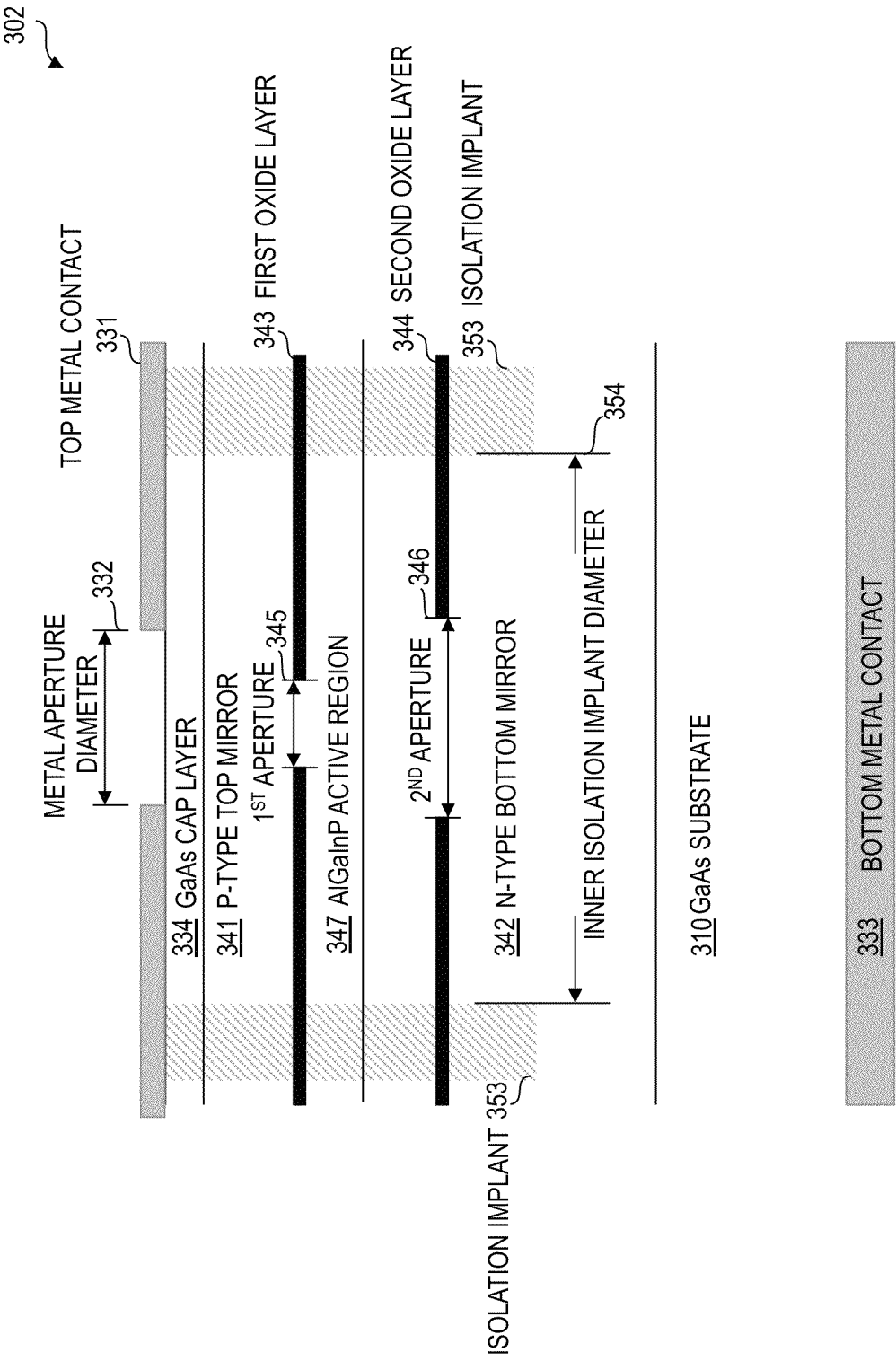
FIG. 3B is a cross-sectional schematic of a VCSEL device 302, according to some embodiments of the present invention.

FIG. 3B is a cross-sectional schematic of a VCSEL device 302, according to some embodiments of the present invention. In some embodiments, VCSEL device 302 is substantially similar to both VCSEL device 102-1 shown in FIG. 1B1 as described above and VCSEL 301 shown in FIG. 3A as described above, except that VCSEL device 302 includes isolation implant 353 and no spacer layers. In some embodiments, the isolation implant 353 is used to electrically isolate VCSEL device 301 from other VCSEL devices that are adjacent to VCSEL device 301.

Figure 3C:
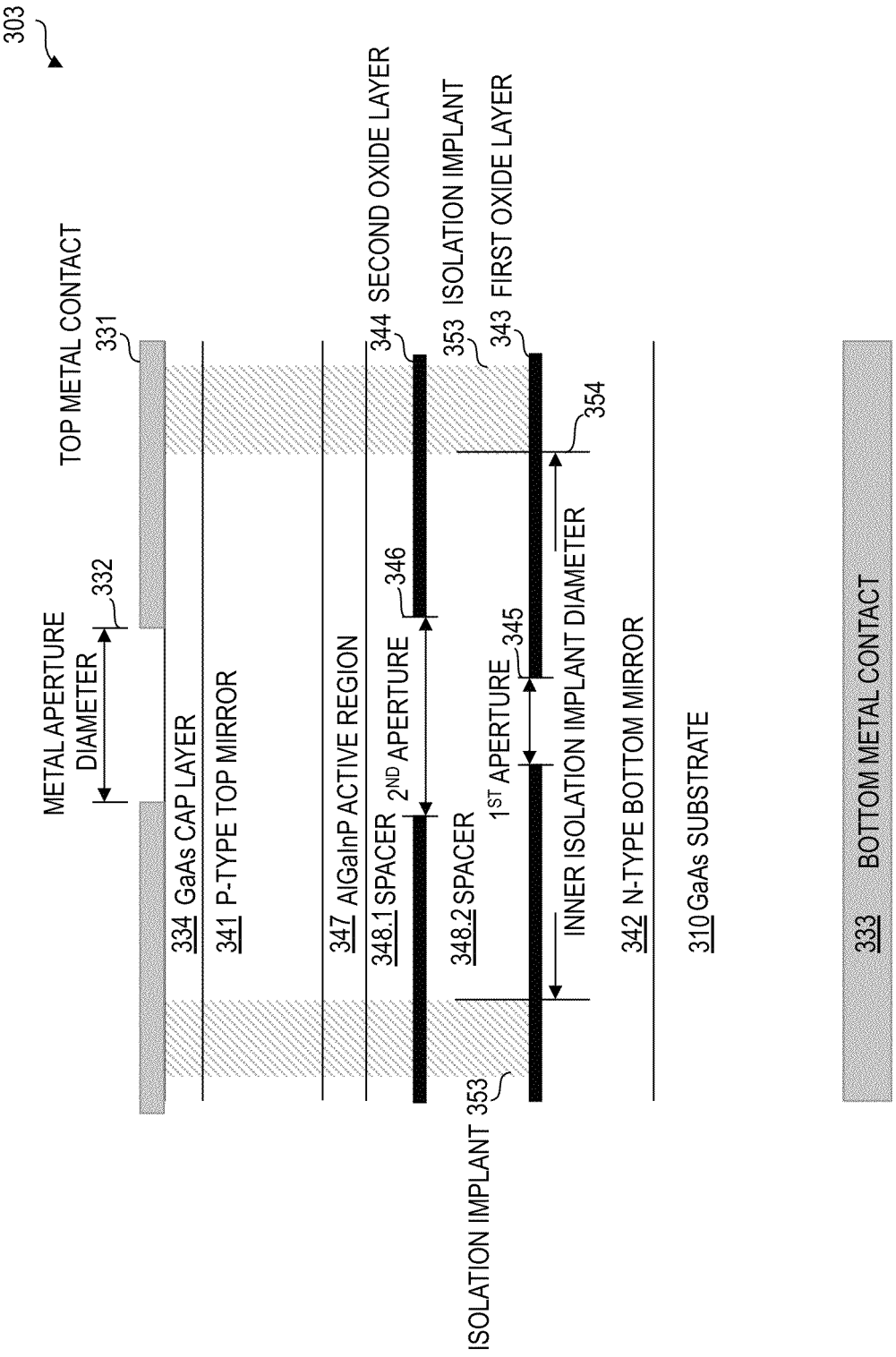
FIG. 3C is a cross-sectional schematic of a VCSEL device 303, according to some embodiments of the present invention.

FIG. 3C is a cross-sectional schematic of a VCSEL device 303, according to some embodiments of the present invention. In some embodiments, VCSEL device 303 is substantially similar to both VCSEL device 103-1 shown in FIG. 1C1 as described above and VCSEL device 301 shown in FIG. 3A as described above, except that VCSEL device 303 includes isolation implant 353 and multiple space layers 348.1 and 348.2. In some embodiments, the isolation implant 353 is used to electrically isolate VCSEL device 301 from other VCSEL devices that are adjacent to VCSEL device 301.

Figure 4B:
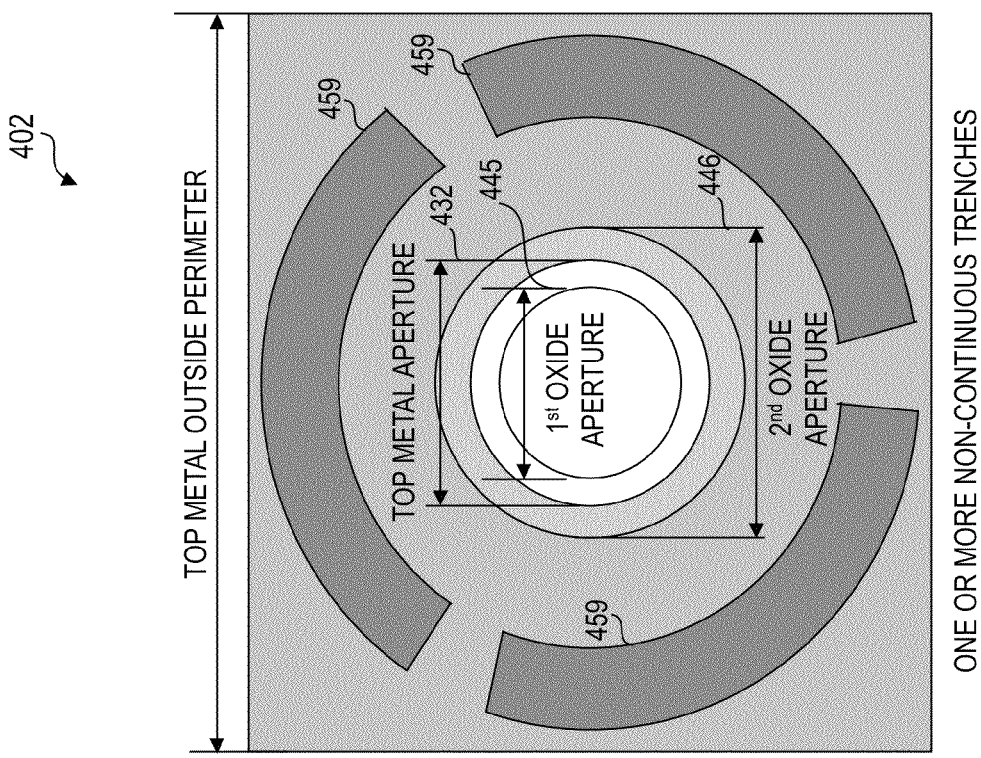
FIG. 4B is a plan-view schematic of a VCSEL device 402, according to some embodiments of the present invention.
Figure 4A:
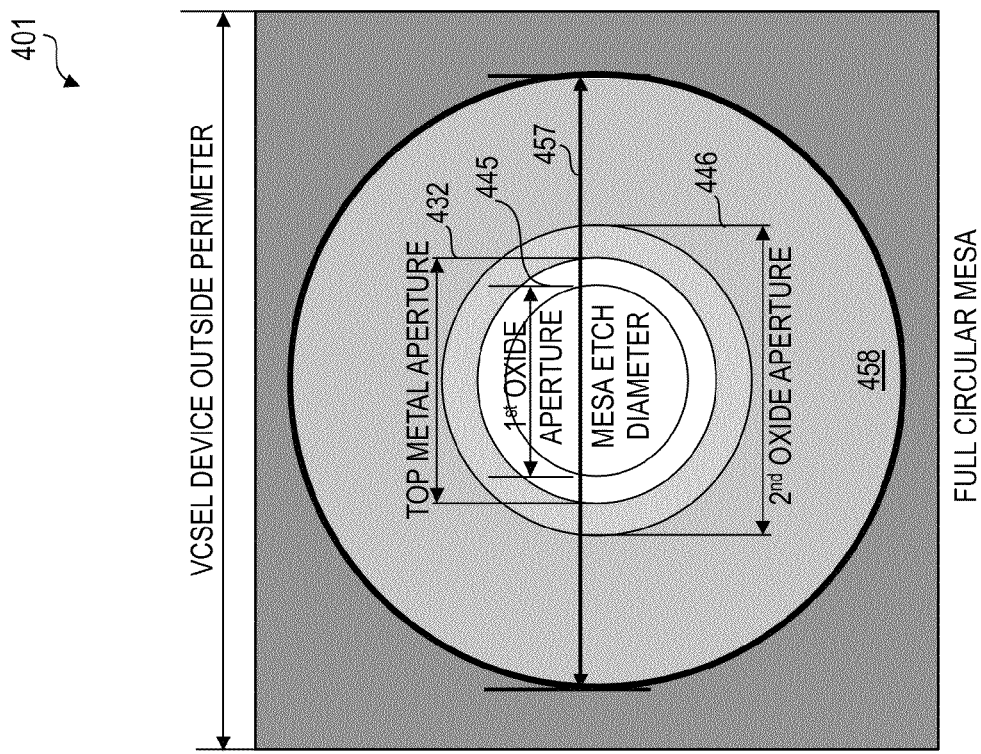
FIG. 4A is a plan-view schematic of a VCSEL device 401, according to some embodiments of the present invention.

FIG. 4A is a plan-view schematic diagram of VCSEL device 401, according to some embodiments of the present invention, and FIG. 4B is a plan-view schematic diagram of VCSEL device 402, according to some embodiments of the present invention. In some embodiments, VCSEL device 401 includes a first oxide aperture 445 provided to primarily act as a weak index guide to generate single-mode optical laser light, a second oxide aperture 446 is provided to primarily confine the electrical carriers in the VCSEL device 401, a top metal aperture 432 is provided to output the optical laser light, and a mesa etch diameter 457 defines the diameter of the VCSEL device mesa 458. In some embodiments, the VCSEL device 401 includes a mesa 458 that is provided by etching away a portion of the top layers of the VCSEL device in order to expose the sides of the VCSEL structure, including the Al-containing layers (e.g., first layer 143 and second layer 144, as shown in FIG. 1A) to facilitate the wet oxidation of the Al-containing layers to form oxide apertures (e.g., first oxide aperture 145 and second oxide aperture 146, as shown in FIG. 1A).

In some embodiments, the mesa etch includes etching away a portion of the cap layer 134, the first mirror 141, the first layer 143, the spacer layer 148, and the second layer 144, as shown in FIG. 1A. In other embodiments, the mesa etch further includes etching away a portion of the MQW structure 147, the second mirror 142, and a non-zero thickness of the substrate 110, as shown in FIG. 1A. In some embodiments, the mesa is formed with conventional semiconductor fabrication techniques by using a wet etch process, a dry etch process, or a combination of both a wet etch process and a dry etch process.

In some embodiments, instead of forming a complete mesa structure in the VCSEL device 402, one or more non-continuous trenches 459 are provided to facilitate access to the Al-containing layers (e.g., first layer 143 and second layer 144, as shown in FIG. 1A) to facilitate the wet oxidation of the Al-containing layers to form oxide apertures (e.g., first oxide aperture 145 and second oxide aperture 146, as shown in FIG. 1A). In some such embodiments, the one or more non-continuous trenches 459 improve the ability to provide contact/bonding metal to the top metal contact without the need to run metal over a mesa structure, as is required with a mesa-structure VCSEL device (e.g., VCSEL device 401). In other embodiments, a polymer material (not shown) is provided to surround the mesa 458 and provide a leveling support structure on which to deposit the top metal contact.

In some embodiments, any embodiments described in the present application that include at least one oxide aperture can use either the mesa structure as shown in FIG. 4A or the trench structure as shown in FIG. 4B, or a combination of the mesa structure and the trench structure, such that the oxidation proceeds from either the discontinuous trenches or the side of the mesa. In some embodiments, the metal aperture 432 is slightly larger (>2 µm), or equal to, or slightly smaller (<2 µm) than the optical-confining oxide aperture. In some double-oxide aperture embodiments, the metal output aperture 432 opening is equal to the smaller oxide aperture 445 opening.

In some embodiments, the distance from the edge of the trench or mesa to the tip of the oxide is >12 µm in order to provide improved thermal performance. In some such embodiments, the mesa size is two times the oxidation distance plus the aperture size, (e.g., for a 10 µm aperture, the total mesa size would be >34 µm).

Figure 5:
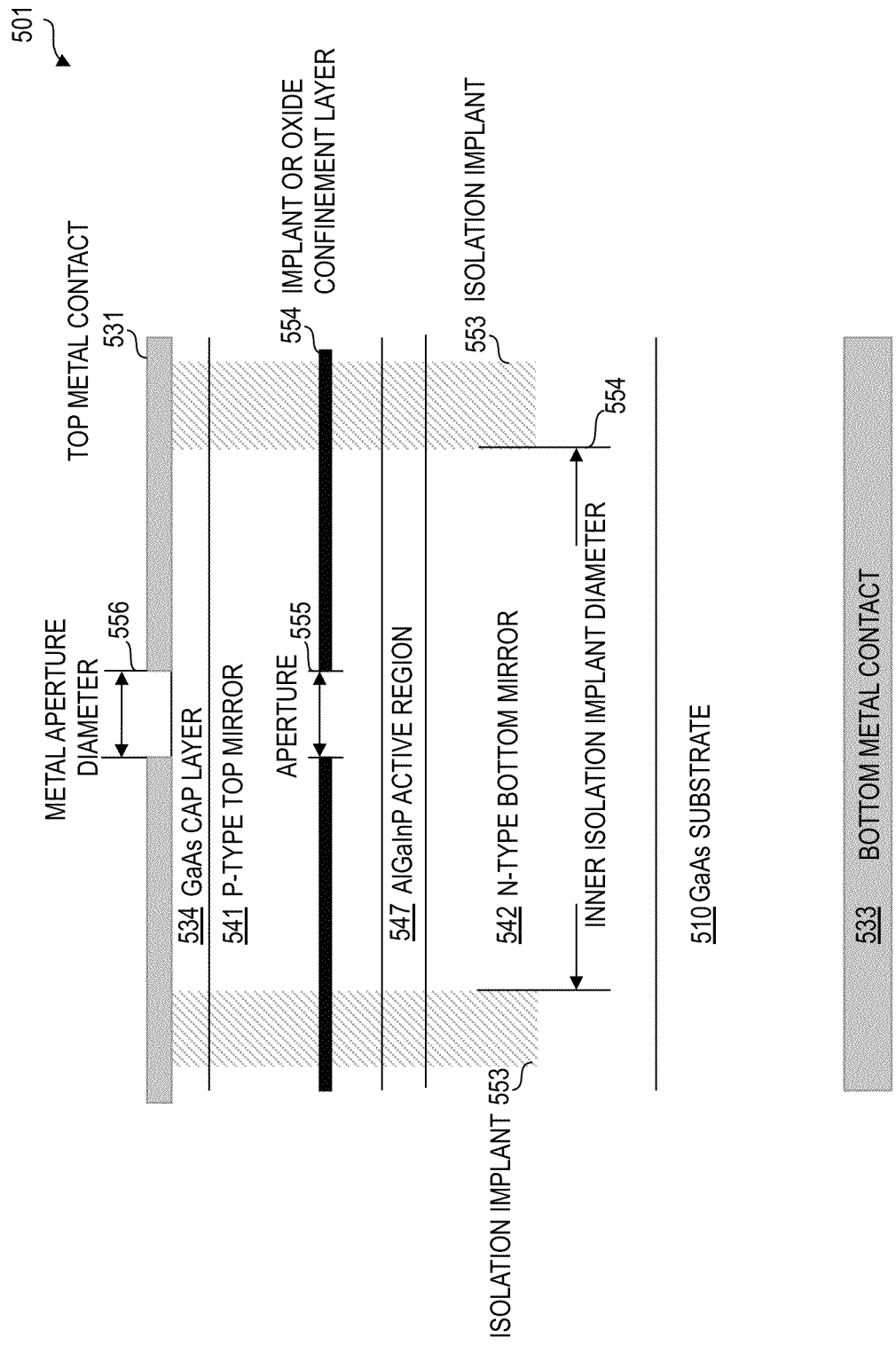
FIG. 5 is a cross-sectional schematic of a VCSEL device 501, according to some embodiments of the present invention.

FIG. 5 is a cross-sectional schematic of a VCSEL device 501, according to some embodiments of the present invention. In some embodiments, VCSEL device 501 includes an aperture 555 and a metal aperture 556 formed in top metal contact 531. In some embodiments, the aperture 555 is formed using a proton implantation process to form an implant region 554 and in other embodiments the aperture 555 is formed in an Al-containing layer 554 using a wet oxidation process. In some embodiments, metal aperture 556 has a diameter that is about 2 µm smaller than the diameter of the aperture 555 to output only the primary optical mode with improved reliability and increased output power. In other embodiments, metal aperture 556 has a diameter that is about equal to or about 2 µm larger than the aperture 555 in order to output multiple optical modes having improved efficiency.

Example VCSELs

Various red VCSEL structures having at least one intracavity oxide confinement layer, as described in various embodiments above, were constructed and tested for output power, temperature range of operation, achievable wavelength range, and reliability in the red wavelength region. Each VCSEL was grown on 4" n+-GaAs substrates. The DBR mirrors were AlGaAs based with graded interfaces between the high and low index layers, as described above. The active regions consisted of strained InGaP quantum wells with AlGaInP spacers and confining region. A highly doped contact layer was grown at the top surface to facilitate formation of ohmic contacts. Current and index confinement was provided by an intracavity oxide confinement layer having a first aperture, and optical confinement was provided by a second aperture in the top metal contact layer.

The devices were top-emitting, with a broad-area gold contact made to the back side of the devices, and a ring contact patterned around the current aperture on the front side of the devices. The VCSEL structures varied in that a variety of aperture sizes were included on the masks to evaluate performance as a function of aperture size. Some die consisted of an array of apertures connected to a common anode in order to increase the total power output that could be achieved.

Testing

Wafers were probed on an automated probe station with a temperature controlled chuck. 100% probe testing of the light output and voltage versus drive current (L-I-V) and wavelength was performed at 40° C. L-I-V measurements were made over a range of temperatures on a sample basis. Devices were packaged in a TO-46 header for measurement of beam profiles, and for measurement of pulsed characteristics.

Reliability measurements under pulsed conditions were carried out on devices in hermetic TO-46 packages. Resistance to humidity was evaluated at 50° C., 85% humidity on devices packaged in TO-46 headers but with the glass window removed from the lid. In both cases devices were biased during life testing at the accelerated environmental conditions. However, the devices were removed from the oven at each test point, and tested at room temperature and humidity, which was typically 20-25° C. and 40% relative humidity.

Results

Temperature Performance

One of the most challenging aspects of designing red VCSELs has been achieving useable output power over the temperature ranges required by the various desired applications.

Figure 12A:
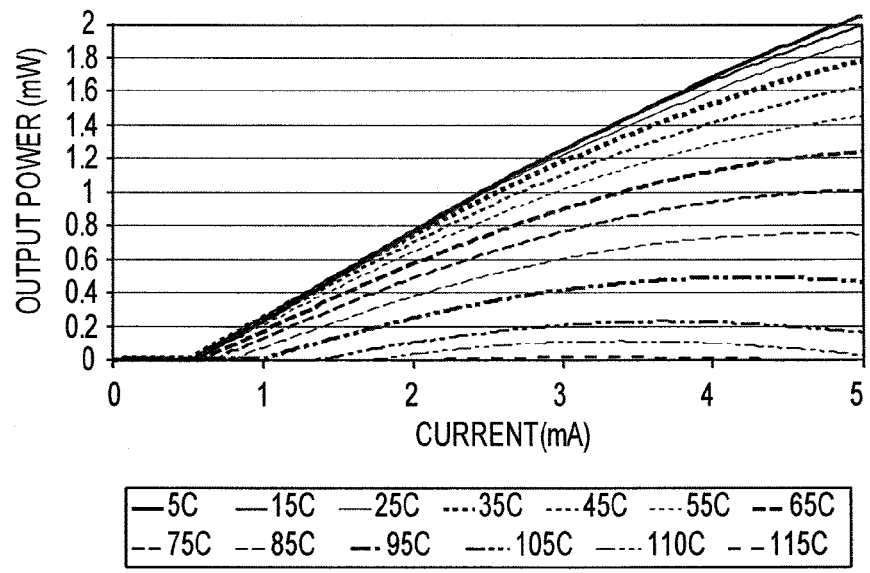
Figure 12B:
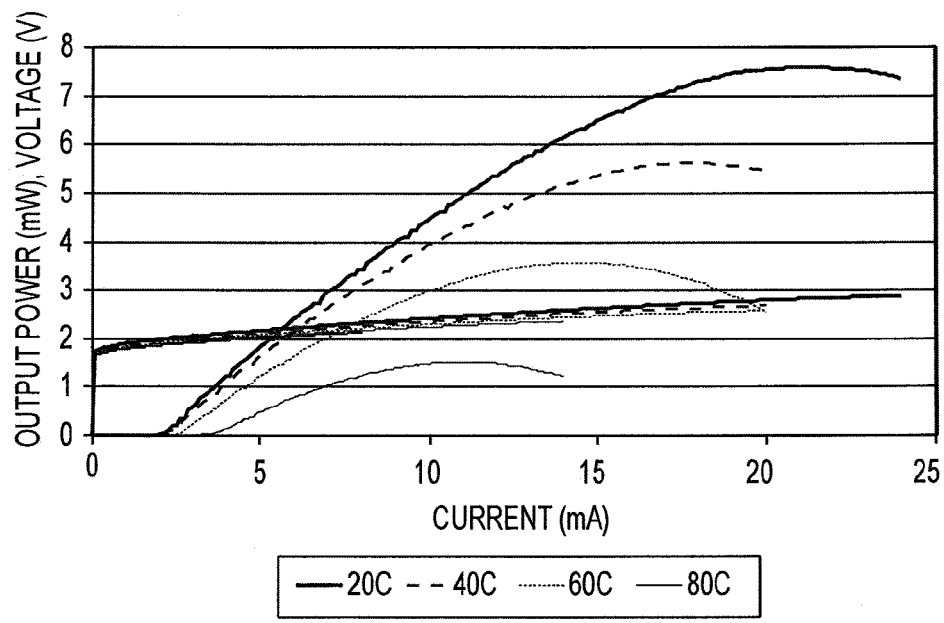
Figure 13A:
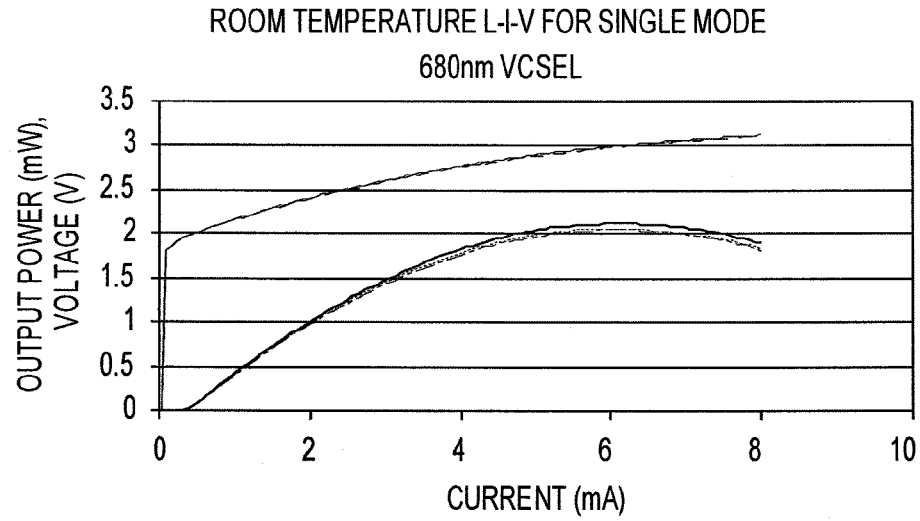
Figure 13B:
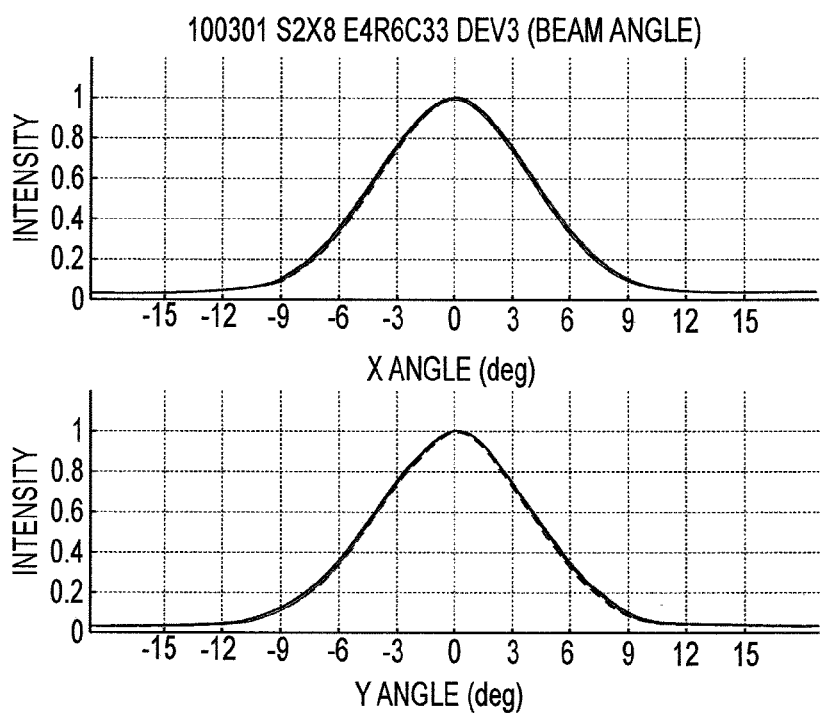

FIG. 12 illustrates the temperature performance of two 680 nm VCSEL devices: a single-mode design, and a multi-mode design. Specifically, FIG. 12 illustrates the light output and voltage versus current (L-I-V) at a range of temperatures for (a) a single-mode device, and (b) a multi-mode device The single mode device (FIG. 12(a)) lases up to 115° C., with 1 mW of output power achievable at 75° C., and 0.5 mW at 95° C. FIG. 12(b) illustrates the temperature performance of a multi-mode 680 nm VCSEL. This device ceases to lase somewhere between 90 and 100° C., but produces 1.5 mW of power at 80° C.

Single-Mode Performance

FIG. 3 further illustrates the performance of single-mode devices. FIG. 3(a) overlays the L-I-V curves of a 1×3 array of single-mode VCSELs. FIG. 3(b) shows the beam profile of one of the devices in the array. Profiles in the x- and y-direction are taken at three different currents, i.e., 4, 5 and 6 mA and are overlaid in the figure of intensity versus angle. It is difficult to distinguish more than one plot since the three plots overlap so closely. Single spatial mode performance is maintained up to the current corresponding to the peak output power.

Wafer Uniformity: Wavelength and Device Performance

One important question of interest in the production of devices may be the uniformity across a wafer. The wavelength of a VCSEL is approximately proportional to thickness of the layers, so a 1% variation of thickness can result in approximately a 7 nm variation in wavelength. In addition, the oxidation diameter can also vary across a wafer due to small differences in layer thickness, doping, or composition. Both of these effects can impact performance of a VCSEL. For instance, the temperature characteristics of a VCSEL depend upon the offset between the gain peak and the Fabry-Perot resonance. Since the gain peak wavelength is less sensitive to thickness and therefore nearly constant across the wafer, while the Fabry-Perot resonance may have a range of 5-10 nm, this offset varies across the wafer.

Figure 14A:
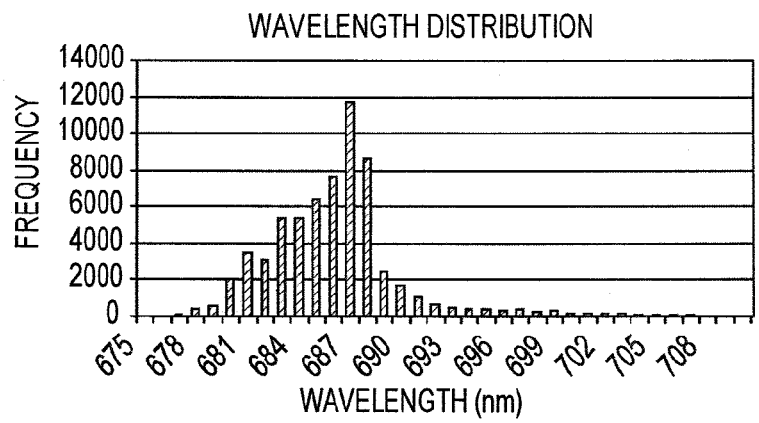
Figure 14B:
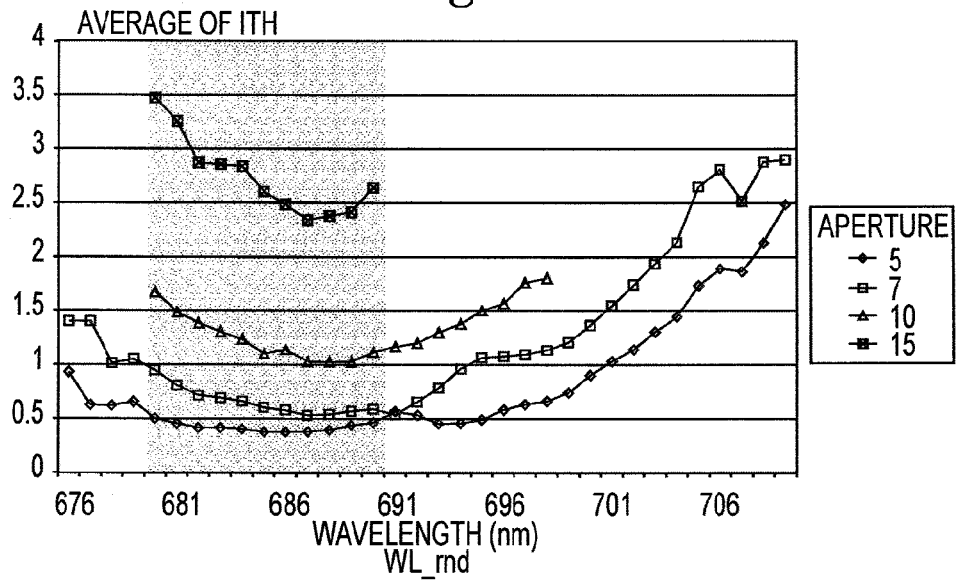
Figure 14C:
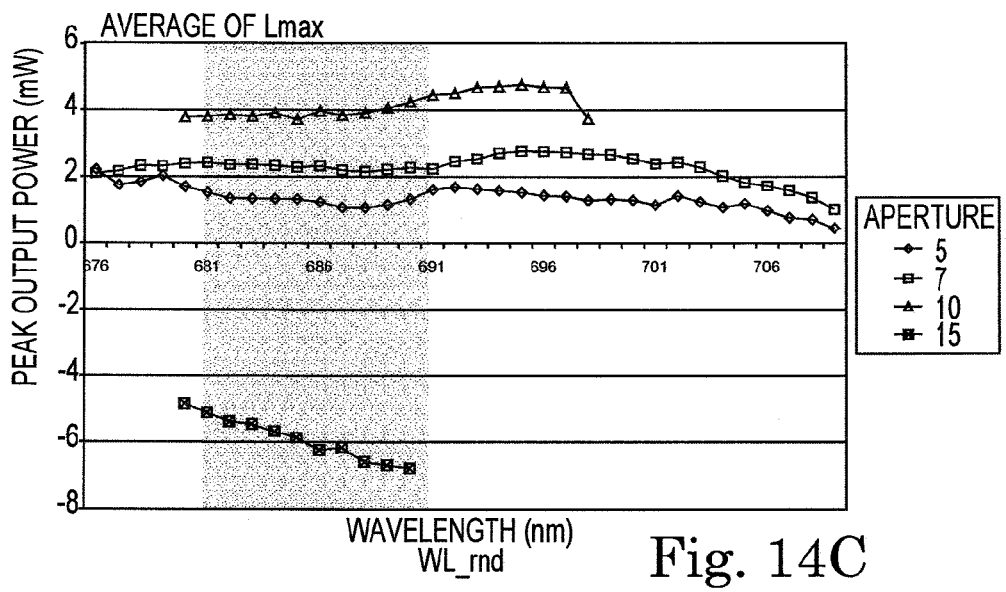

Our testing allowed us to gather statistics on uniformity. FIG. 14 shows the results of probing approximately 60,000 VCSELs on a 4" wafer. A histogram of the wavelength distribution of the devices is shown in FIG. 14(a). While the distribution ranges from 675 nm to 709 nm, the vast majority of the devices on the wafer lie in the range from 681 to 689 nm. FIG. 14(b) illustrates the uniformity of threshold current as a function of emission wavelength for four different laser aperture sizes. This data was taken at 40° C. The shaded region in the figure corresponds to the wavelength range constituting the majority of the devices on the wafer, as illustrated in FIG. 14(a). Threshold currents are less than 0.5 mA for the smallest devices and around 2.5 to 3 mA for the 15 µm apertures at 40° C. While the largest diameter devices appear to be quite a bit less uniform than the smallest diameter devices, on a percentage basis, the threshold current range of the 15 µm device is similar to that of the 7 and 10 µm devices. As one might expect, the threshold current rises as the emission wavelength increases, due to a larger offset between the gain peak and the Fabry-Perot cavity, but devices are still lasing at 709 nm, where the offset is approximately 40 nm. Peak output power at 40° C. versus wavelength for several aperture sizes is shown in FIG. 14(c). Note that the 15 µm aperture device power is shown as negative, which was an internal code used for indicating that the output power had not yet reached a peak at the maximum current tested, and hence underestimates the peak output power. Within the wavelength region included in the shaded region, which includes the majority of the VCSELs on the wafer, the peak output power is quite uniform.

Maximum Achievable Output Power

Figure 15A:
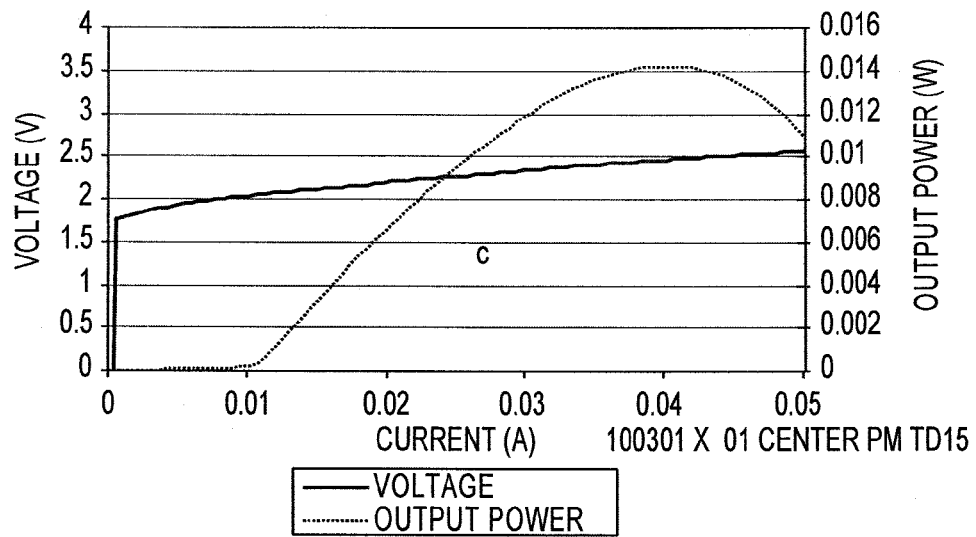
Figure 15B:
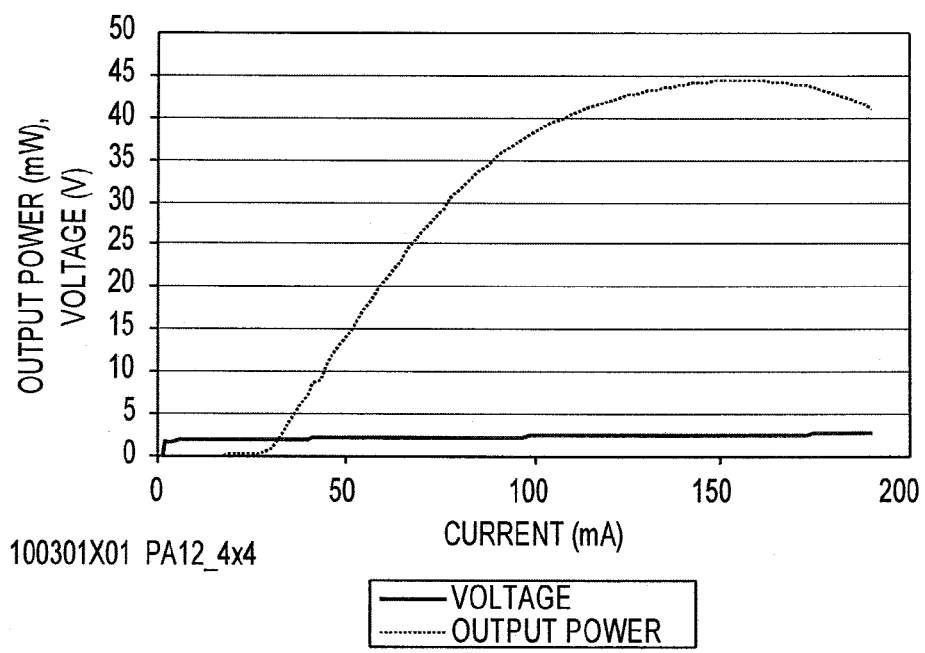

Red VCSELs have typically been limited in the maximum output power that can be achieved from a conventional all-epitaxial structure, in part because the larger aperture devices are more sensitive to temperature. Improved thermal design has allowed larger devices to be built. FIG. 15 illustrates the output power achievable from two types of devices. FIG. 15(a) shows the L-I-V from a single, large diameter aperture VCSEL device. The device emits a peak output power of 14 mW. If beam size or optical quality are not an issue, an alternative way of achieving high output power is to use multiple apertures with a common anode contact. FIG. 15(b) illustrates that nearly 45 mW of output power at room temperature can be generated from an array of apertures within a 200 µm×200 µm area.

Extended Wavelength Performance

Figure 16B:
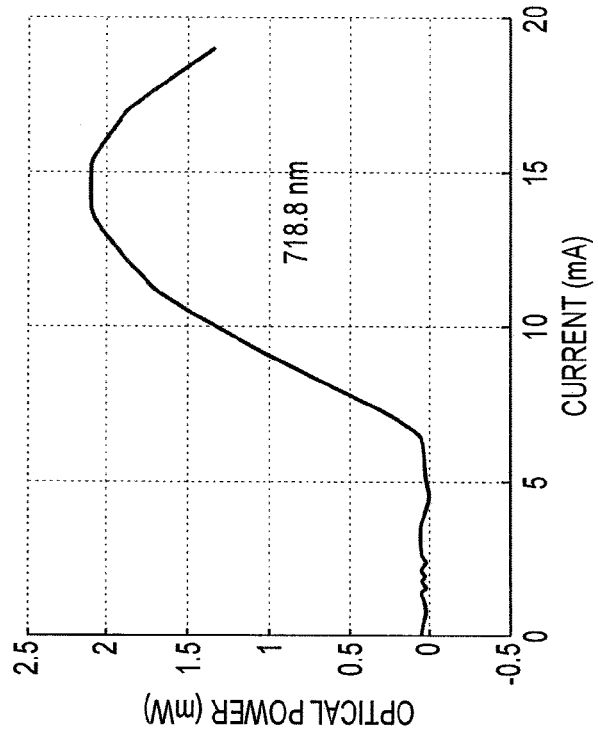
Figure 16A:
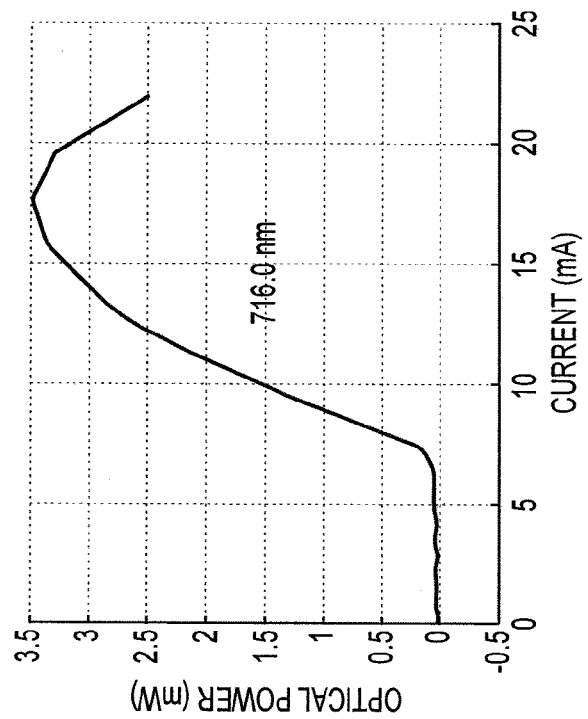

VCSEL devices based upon GaInP/AlGaInP active regions with wavelengths in the range from 700-720 nm were fabricated. A large variation in wavelength across a single wafer was achieved by not rotating the wafer during growth. The gain peak wavelength was fairly constant at around 678 nm, while the Fabry-Perot resonance varied from 680 up to nearly 720 nm. The longest wavelengths, therefore, corresponded to a very large gain peak-Fabry Perot resonance offset, as large as 40 nm. FIG. 16 shows the results from two devices at the higher end of the wavelength range. The devices lased continuous wave (CW) at room temperature. A 716 nm device (FIG. 16(a)) had a threshold current of 7 mA and a peak output power of nearly 3.5 mW, while a 718.8 nm device had a threshold current of 7 mA and a peak output power of over 2 mW. The threshold current is high due to the large gain peak-resonance offset, so it is expected that even better performance could be achieved if the devices were optimally designed for this wavelength. Thus, good VCSEL performance spanning the entire wavelength range from 650 to 850 nm can be achieved using either an AlGaAs materials system, or AlGaInP materials for the active region.

Pulsed Operation and Reliability

There are some applications where lasers are typically pulsed at a low duty cycle, such as industrial sensors or computed radiography. The pulse width could be in the range of 1 µsec, while the duty cycle might be less than 25%. It has been demonstrated at other wavelengths that the peak output power can be extended significantly due to the reduction in self-heating when pulsed. Red VCSELs of the type herein are even more limited by thermal effects and hence this test quantifies the magnitude of potential improvement that could be achieved if these devices were pulsed.

FIG. 17 illustrates the performance of a multi-mode 680 nm VCSEL operated in pulsed mode. The relevant parameters affecting pulsed performance are pulse width, duty cycle, and ambient temperature. Since 1 µsec is a nominal thermal time constant for a VCSEL chip, pulse widths substantially longer than this provide little benefit. We have used 1 µsec pulse width for the evaluation, although shorter pulse widths can provide even higher peak power. FIG. 17(a) illustrates the effect of the duty cycle on improved peak output power. A 10% duty cycle can provide nearly a 4× improvement in peak power, while a 50% duty cycle still provides nearly a 2× increase in peak power. Also note that the peak power achieved at a 10% duty cycle exceeds 35 mW. This is a multi-mode device with a single aperture. FIG. 17(b) illustrates the improvement in the temperature range of operation that can be achieved when the device is pulsed at a 25% duty cycle. The peak power of the device at 60° C. reaches 15 mW, while under CW operation, the same device might reach a peak power of 3-4 mW.

In pulsed mode, the device self-heating is reduced, and therefore the device rollover point (where increasing the current actually results in a reduction of output power) is extended to significantly higher drive current. However, this leads to a question: if device lifetime is reduced by higher current drives, can one operate a device in pulsed mode at these higher current ranges without impacting the device lifetime? Furthermore, are there any transient effects, such as stress created by repeated temperature cycling resulting from the current cycling, that might actually accelerate the degradation of the devices? For instance, the dependence of VCSEL lifetime upon current density is commonly found to be reduced proportionally to the square of the current density, i.e., a 2× increase in current density would reduce device lifetime by a factor of 4. An increase of drive current from 15 mA to 60 mA might be expected to reduce the lifetime by a factor of 16.

A test was developed for testing the VCSELs in pulsed mode. Both single-mode and multi-mode devices were packaged in TO-46 headers and mounted on boards that were placed in ovens. The devices were pulsed with a pulse width of 1 μsec, and a duty cycle of 12.5%. Thus, 8 hours of test time correspond generally to 1 hour of actual "on-time." The devices were periodically removed from the oven and tested CW at room temperature, and then returned to the oven for further aging under pulsed conditions. The results are illustrated in FIG. 18.

As may be seen from FIG. 18, the multi-mode devices have an output power around 5 mW and were pulsed to one of two different current levels, 18 mA or 30 mA. The single-mode devices have an output power of approximately 2.5 to 3 mW and were pulsed to 7 mA. A burn-in effect can be seen in the first 100-200 hours, where the output power increases, but after the burn-in period, the output power has been stable during the 6,596 hours of test at 50° C., which generally corresponds to 824 hours of actual pulsed on-time.

Table 1 below illustrates the differences in acceleration factor one might expect for the CW and pulsed cases. In the table, acceleration factors were compared based on the assumption of a use condition at 25° C. and 10 mA. The thermal resistance of the multi-mode device was measured, and it was found it to be 1.4° C./mW. Acceleration factors for red VCSELs from Duggan, G. Barrow et al., "Red Vertical Cavity Surface Emitting Lasers (VCSELs) for consumer applications," Vertical-Cavity Surface-Emitting Lasers XII, Proc. SPIE 6908, 6908-14 (2008) have been assumed, i.e., an Arrhenius relationship for temperature dependence with an activation energy of 0.6 eV, and a squared dependence on current. These acceleration factors are also representative of that routinely reported for 850 nm VCSELs. We also assumed a thermal resistance of 0 in the pulsed case.

TABLE 1

Calculation of acceleration factors assuming a use condition of 10 mA and 25° C.

| DC or pulsed | Current | Acceleration factor |
|---|---|---|
| DC | 10 | 4.5 |
| | 18 | 88 |
| | 30 | 2438 |
| pulsed | 10 | 6 |
| | 18 | 20 |
| | 30 | 55 |

While the data does not project a lifetime, it does predict a very significant improvement in lifetime under pulsed conditions, assuming no transient effects, which was consistent with our observations. It would be expected that devices operated CW at 30 mA at 50° C. for the equivalent of 824 hours to have failed. The table above indicates that 824 hours at 50° C. and 30 mA would be equivalent to more than 2 million hours at the use conditions of 25° C. and 10 mA. While acceleration due to thermal transients when operated under pulsed conditions cannot be completely ruled out, the lack of degradation observed in FIG. 18 suggests that this is not a significant consideration. During 6,596 test hours, at a period of 8 μsec, the devices have experienced approximately 3 trillion pulses.

In summary, the results show substantial improvements in the temperature range of operation, the magnitude of output power, and the range of wavelengths that can be achieved in red VCSELs. Red VCSELs lasing up to 115° C. for smaller aperture single mode devices and to nearly 100° C. for multi-mode VCSELs have been demonstrated. Furthermore, it has been demonstrated that single mode devices have produced 1 mW of output power up to 60° C., and multi-mode devices provide up to 1.5 mW of power at 80° C. 14 mW of output power at room temperature from a single VCSEL aperture and as much as 44 mW of power from a chip containing multiple apertures within a small area has also been demonstrated.

Additionally, the range of wavelengths achievable from the disclosed materials system has been extended out to 719 nm, with 2 mW of output power at room temperature at that wavelength. While VCSELs in this wavelength range have been demonstrated in the AlGaAs materials system, our results exceed the output power achieved by the previously reported results.

Further yet, the benefits of pulsing the VCSEL, which is a useful mode of operation for some applications, has been illustrated. Peak output power from one multi-mode aperture in excess of 35 mW has been demonstrated for a 10% duty cycle and 1 μsec pulse width. Pulsing also allows extension of the temperature range of operation of the VCSELs. Concerns about potential additional acceleration of failure due to repeated thermal transitions have been allayed by reliability data showing stable operation out to nearly 6,500 hours when pulsed at 30 mA and a 12.5% duty cycle.

Hybrid Dielectric-Semiconductor Mirror Vertical-Cavity Surface-Emitting Laser

In some embodiments, the present invention provides an apparatus and process for VCSEL devices having a top mirror that includes a hybrid dielectric-semiconductor material structure.

Figure 6A:
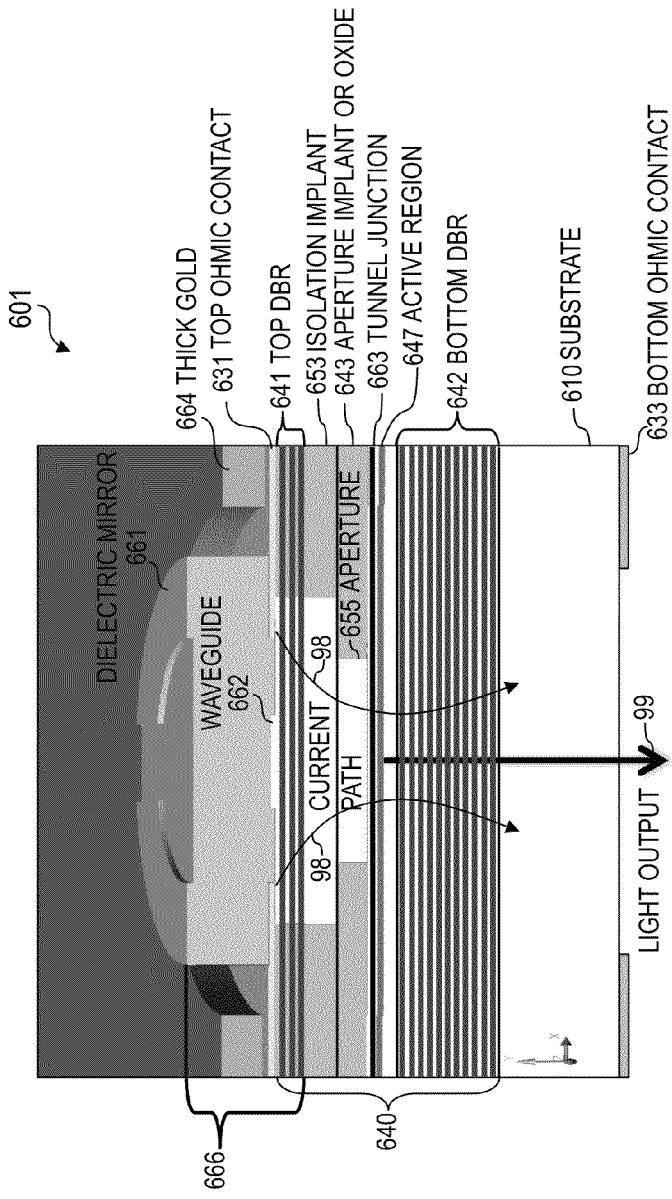
FIG. 6A is a cross-sectional schematic of a VCSEL device 601, according to some embodiments of the present invention.

FIG. 6A is a cross-sectional schematic of a VCSEL device 601 having a hybrid dielectric-semiconductor mirror structure, according to some embodiments of the present invention. In some embodiments, VCSEL device 601 includes a substrate 610 and an epitaxial structure 640 formed on the substrate 610. In some embodiments, the epitaxial structure 640 includes a bottom DBR 642 formed on the substrate 610, an active region 647 (e.g., one or more quantum wells designed to emit a desired wavelength of laser light) formed on the bottom DBR 642, a tunnel junction 663 formed on the active region 647, an aperture implant or oxide material layer 643 configured to include a current confining aperture 655, a top DBR mirror structure 641 formed on the aperture material layer 643, and a waveguide structure 662 formed on the top DBR mirror structure 641. In some embodiments, epitaxial structure 640 further includes an isolation implant layer 653 located above aperture material layer 643 and configured to electrically isolate VCSEL device 601 from neighboring VCSEL devices. In some embodiments, VCSEL device 601 further includes a dielectric mirror structure 661 formed on waveguide structure 662, and, when combined with top DBR mirror structure 642, forms top hybrid-semiconductor-dielectric mirror 666. In some embodiments, VCSEL device 601 includes top ohmic contact 631 that forms an ohmic contact with top DBR layer 642, thick gold layer 664 formed on top ohmic contact 631, and a bottom ohmic contact layer 633 that is formed on the bottom-side of substrate 610 (i.e., the side opposite of the epitaxial structure 640) and forms an ohmic contact with the substrate 610.

In some embodiments, VCSEL device 601 is fabricated using a planar fabrication process that provides improved uniformity for dielectric-mirror 661. In some embodiments, top ohmic contact 631 is an intra-cavity ohmic contact and is located below dielectric mirror 661. In some embodiments, ion implantation or oxide layer 643 is used to form aperture 655 to provide current confinement and a second larger diameter implant 653 is used for isolation between adjacent VCSEL devices. In some embodiments, isolation implant 653 is formed by implanting He+ to isolate n-type material with a diameter of about 4 µm to about 20 µm larger than the oxide aperture or proton implant 655 used for current confinement.

In some embodiments, current confinement 98 is provided by a proton implant positioned to deactivate the tunnel junction 663, and/or an oxide aperture; and could be located either above or below the active region 647. In some embodiments, a mesa etch and/or a trench etch is used for providing the oxide aperture confinement.

In some embodiments, a metal aperture is provided to emit the optical laser light and has an opening that is equal to or larger than the opening of the current-confinement aperture 655.

In some embodiments, tunnel junction 663 is formed from a thin p-type material layer formed on an n-type material layer and allows for two low-absorbing n-doped mirrors, as opposed to one low-absorbing n-doped mirror and one moderate-absorbing p-doped mirror.

In some embodiments, a shallow etched mesa 662 is used to provide index guiding. In some embodiments, the shallow etched mesa 662 has a diameter that is no less than 10 µm smaller than and no more than 10 µm larger than the diameter of the current confinement aperture 655 (e.g., if the diameter of the current confinement aperture 655 is 30 µm, the diameter of the shallow etched mesa will be between about 20 µm and about 40 µm. In some embodiments, a shallow mesa etch (e.g., an etch that removes less than about 1 µm) in the semiconductor top-DBR-mirror layers 642 is used to fabricate etched mesa waveguide 662 to provide optical-mode confinement of the emitted laser light.

In some embodiments, the bottom DBR mirror 610 is formed entirely of alternating semiconductor material layers having between about two periods to about 50 periods.

In some embodiments, top mirror 666 includes a hybrid-semiconductor-dielectric mirror that is formed from top DBR mirror 642 that includes between about zero (0) periods and about twelve (12) periods of alternating semiconductor material layers and dielectric mirror 661 that includes between about one (1) period and about eight (8) periods of alternating dielectric material. In other embodiments, top mirror 666 further includes a metal layer (not shown) formed on the top of the dielectric mirror 661 to provide even higher reflectivity with fewer semiconductor and/or dielectric mirror periods. In some embodiments, the top DBR semiconductor mirror layers 642 further include an etch stop layer (not shown) to provide a selective wet etch of the mesa 662 and precise etch-depth control. In other embodiments, top DBR semiconductor mirror 642 includes a highly doped ohmic-contact layer formed such that the top ohmic contact layer 631 forms a metal contact having a low-specific-contact resistivity to the top DBR layers 642.

In some embodiments, a thin metal contact is formed under at least a portion of dielectric mirror 661 and has a thickness of less than about 0.3 µm in order to diminish perturbations in the thickness of dielectric mirror 661.

In some embodiments, an anti-reflection coating (not shown) is included on the output window for embodiments providing laser-light emission through substrate.

In some embodiments, VCSEL device 601 includes a hybrid-semiconductor-dielectric DBR mirror 666 combined with an oxide aperture 655 and/or a shallow-mesa etch 662 to output single-mode laser operation.

In some embodiments, VCSEL device 601 is useful for all laser wavelengths (i.e., VCSEL device 601 is useful for emitting laser light having a wavelength that is in the range of all wavelengths that are capable of being emitted by semiconductor-based laser devices). In some embodiments, VCSEL device 601 is designed to emit laser light having a wavelength in the range of about 250 nm to about 3,000 nm). In some embodiments, VCSEL device 601 is designed to emit a laser signal having a wavelength of about 1850 nm.

In some embodiments, VCSEL device 601 is designed to emit a laser-light signal having a wavelength of greater than about 1700 nm. In some such embodiments, the top and bottom DBR mirror structures 641 and 642 include alternating layers of InP/InGaAs and provide improved index of refraction contrast, lower thermal resistance, and are doped either n-type or p-type, and in some embodiments, include graded interfaces of varying InGaAsP composition located between the alternating layers of InP/InGaAs in order to provide lower electrical resistance DBR mirrors.

In some embodiments, the tunnel junction 663 is included for long-wavelength emitting VCSEL devices that have high-optical absorption of the long-wavelength laser light in p-type materials, in order that both the top and bottom DBR mirrors 641 and 642 can be doped n-type. In some embodiments, the tunnel junction 663 is not necessary for all laser-light wavelengths VCSEL device 601 emits, as described herein. However, the tunnel junction 663 is beneficial for red-wavelength emitting VCSELs, and the tunnel junction 663 is less necessary in VCSEL devices that emit laser light in the range of about 800 nm to about 1000 nm devices.

In some embodiments, VCSEL device 601 emits laser light having a wavelength of greater than about 1,300 nm from the substrate 610 (i.e., bottom emission). In other embodiments, VCSEL device 601 emits laser light having a wavelength of less than about 950 nm from the dielectric mirror 661 (i.e., top emission). In even other embodiments, VCSEL device 601 emits laser light having a wavelength of greater than about 950 nm and less than about 1300 nm and bottom laser-light emission (i.e., from the substrate 610) and/or top laser-light emission (i.e., from the dielectric mirror 661) is used.

In some embodiments, VCSEL device 601 includes features and methods described and set-forth in U.S. Pat. No. 7,359,421 by Mary K. Brenner, et al. issued Apr. 15, 2008, titled "RED LIGHT LASER," U.S. Pat. No. RE41,738 by Mary K. Brenner, et al. issued Sep. 21, 2010, titled "RED LIGHT LASER," and United States Patent Application 2010/0220758 by Mary K. Hibbs-Brenner, et al. published Sep. 2, 2010, titled "DIRECT MODULATED MODIFIED VERTICAL CAVITY SURFACE EMITTING LASERS," each of which are incorporated herein in their entirety by reference.

Figure 6B:
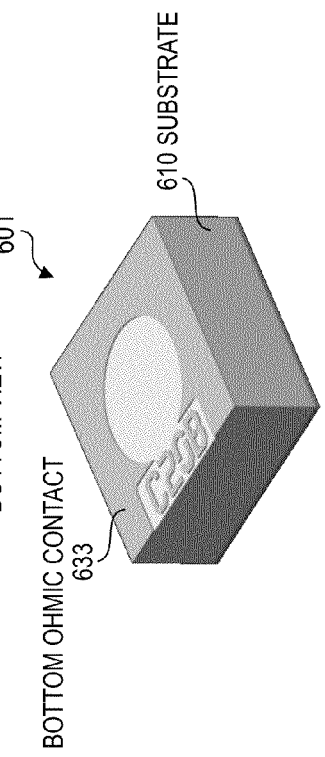
FIG. 6B is a top-view perspective diagram of a VCSEL device 601, according to some embodiments of the present invention.

FIG. 6B is a top-view perspective diagram of a VCSEL device 601 and shows the dielectric mirror 661, the top-ohmic-contact layer 631, the thick-gold contact layer 664, and the substrate 610, according to some embodiments of the present invention.

Figure 6C:
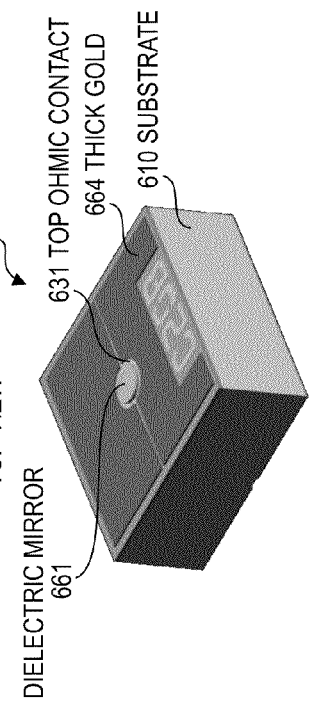
FIG. 6C is a top-view perspective diagram of a VCSEL device 601, according to some embodiments of the present invention.

FIG. 6C is a top-view perspective diagram of a VCSEL device 601 and shows the bottom-ohmic-contact layer 633, according to some embodiments of the present invention.

Figure 6D:
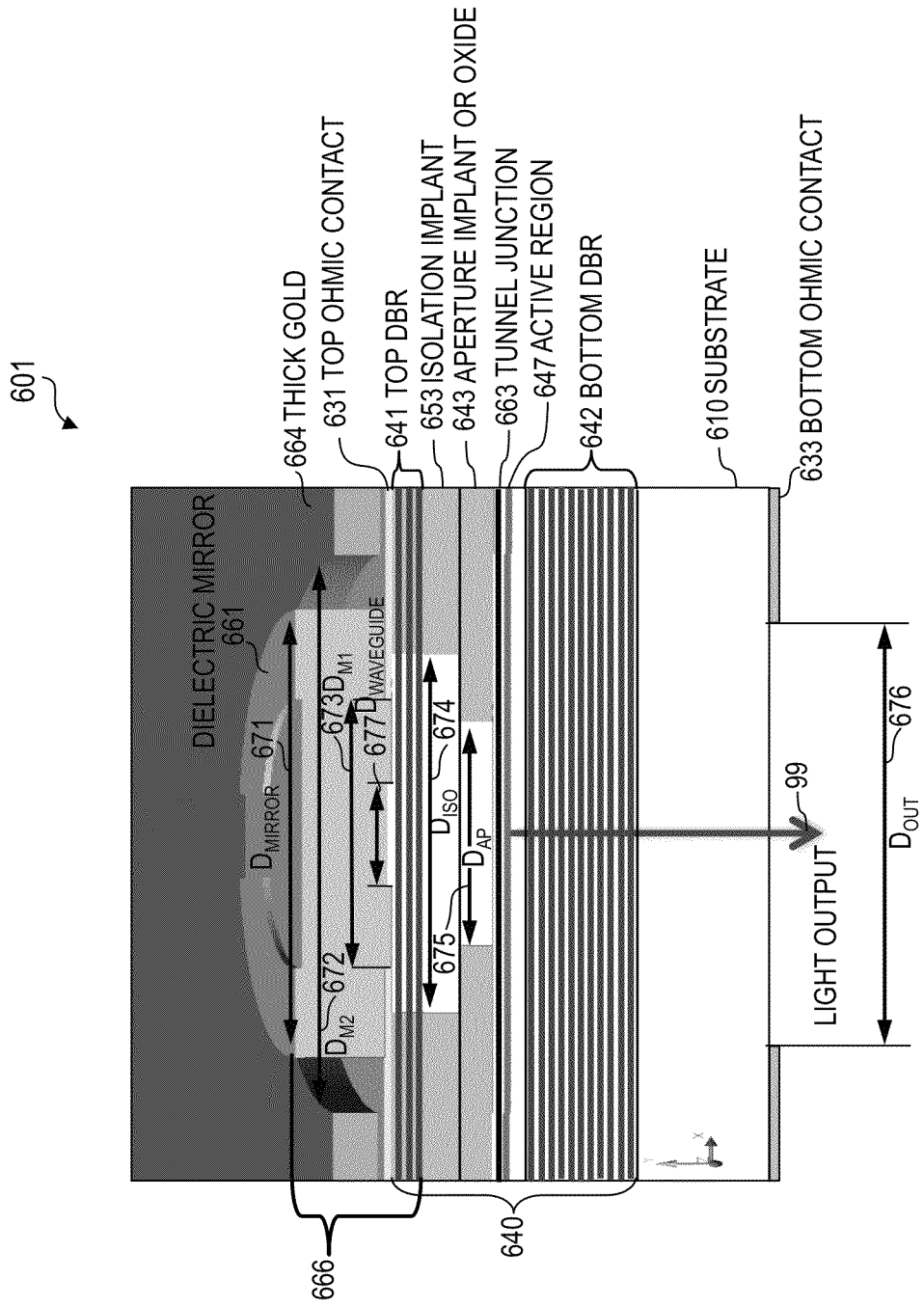
FIG. 6D is a cross-sectional schematic of a VCSEL device 601, according to some embodiments of the present invention.

FIG. 6D is a cross-sectional schematic of a VCSEL device 601 and illustrates various dimensions of VCSEL device 601, including $D_{MIRROR}$ 671, the diameter of the dielectric mirror 661, $D_{M2}$ 672, the diameter of the aperture opening in thick-gold layer 664, $D_{M1}$ 673, the diameter of the aperture in top ohmic contact 631, $D_{ISO}$ 674, the diameter of the aperture in the isolation implant region 653, $D_{AP}$ 675, the diameter of aperture 675 in the aperture implant or oxide layer 643, and $D_{OUT}$ 676, the diameter of the output aperture in bottom ohmic contact 633, and the diameter of the etched mesa waveguide 662, $D_{waveguide}$ 677, according to some embodiments of the present invention.

FIG. 6E shows Table 605 and FIG. 6F shows Table 606, wherein each table describes various dimensions of VCSEL device 604, according to some embodiments of the present invention. As used herein, the Contact offset=$(D_{M1}-D_{AP})/2$ and the Isolation offset=$(D_{ISO}-D_{AP})/2$.

Figure 7:
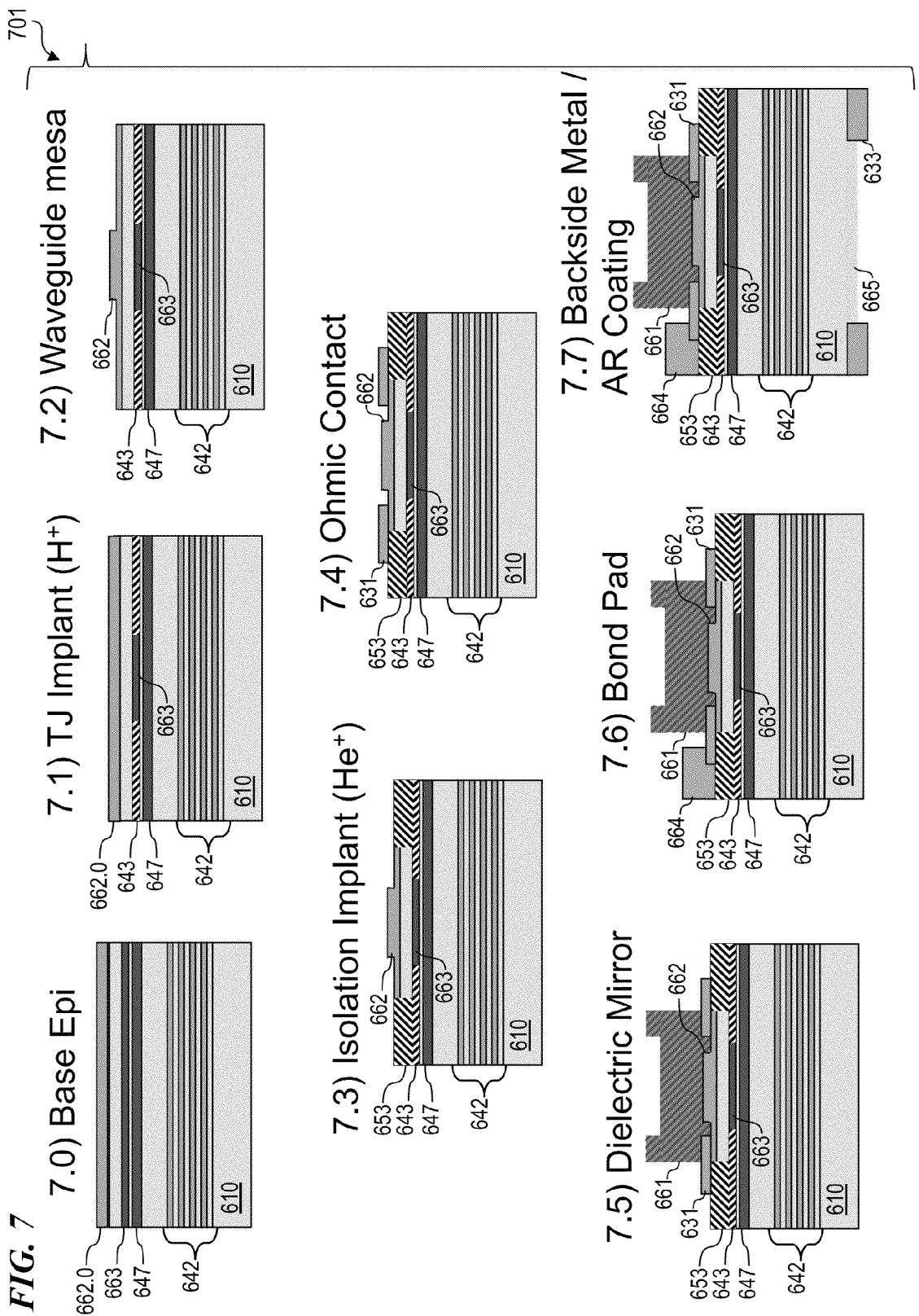
FIG. 7 is a VCSEL fabrication method 701 illustrating fabrication steps in the manufacture of VCSEL device 601, according to some embodiments of the present invention.

FIG. 7 is a VCSEL fabrication method 701 illustrating fabrication steps in the manufacture of VCSEL device 601 shown in FIGS. 6A, 6B, 6C, and 6D and described above, according to some embodiments of the present invention. In some embodiments, VCSEL fabrication method 701 begins by providing the starting epitaxial material as shown in "7.0) Base Epi," wherein the base epi includes substrate 610, bottom DBR 642, active region 647, tunneling junction 663, and waveguide layer 662.0. In some embodiments (not shown in FIG. 7), the base epi further includes a top semiconducting DBR mirror 641 located between tunneling junction 663 and waveguide layer 662.0. In some embodiments, a proton implant or a He+ implant is performed to form implant region 643 and provide charge-carrier confinement, as shown in "7.1) TJ Implant ($H^+$)". In some embodiments, a wet and/or dry etch is performed to selectively etch the waveguide layer 662.0 to form the waveguide mesa 662, as shown in "7.2) Waveguide mesa". In some embodiments, a proton or helium implant is performed to form isolation implant region 653 and provide electrical isolation between VCSEL device 601 and other adjacent VCSEL devices, as shown in "7.3) Isolation Implant ($He^+$)". In some embodiments, top ohmic contacts 631 are selectively formed in contact with the remaining portion of waveguide layer 662.0 of VCSEL device 601, as shown in "7.4) Ohmic Contact". In some embodiments, dielectric mirror 661 is formed in contact with waveguide mesa 662 and partially overlaps top-ohmic contacts 631, as shown in "7.5) Dielectric Mirror". In some embodiments, bond pad 664 is formed partially overlapped with top ohmic contacts 631, as shown in "7.6) Bond Pad". In some embodiments, backside metal 633 having an output aperture is formed on the bottom side of substrate 610 and an optional anti-reflective coating 665 is applied to at least the bottom of the substrate 610 in the output aperture region, as shown in "7.7) Backside Metal/AR Coating".

Figure 8:
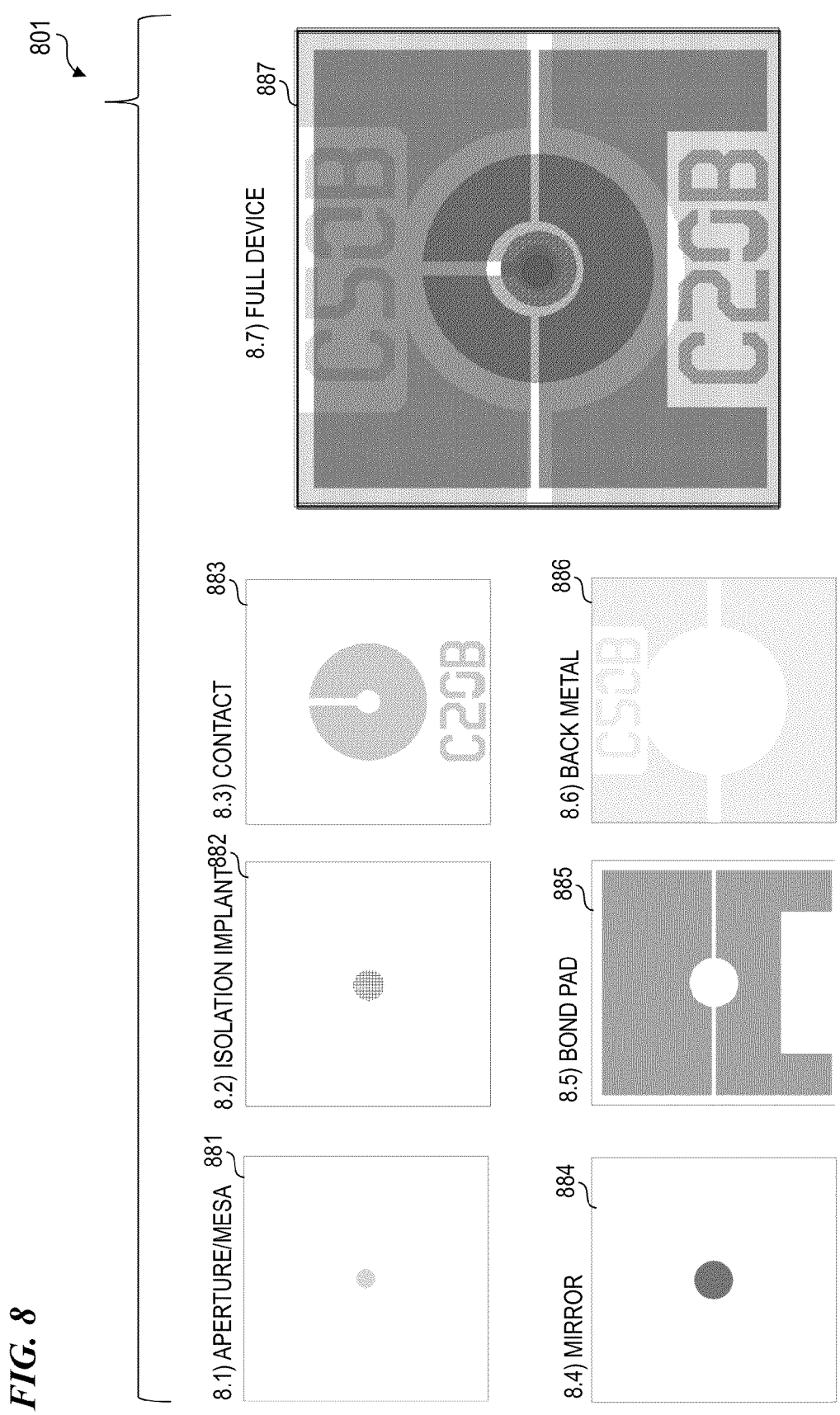
FIG. 8 is a VCSEL fabrication mask set 801 used for fabrication of VCSEL device 601 according to some embodiments of the present invention.

FIG. 8 is a VCSEL fabrication mask set 801 used for fabrication of VCSEL device 601, according to some embodiments of the present invention. In some embodiments, VCSEL device 601 is fabricated using the following masks:
  "8.1) Aperture/Mesa Mask"—Is used to define both the waveguide mesa 662 and the aperture 655.
  "8.2) Isolation Implant Mask"—Is use to define the aperture opening 674 in the isolation implant region 653.
  "8.3) Contact Mask"—Is used to define the top-ohmic-contact metallization 631.
  "8.4) Mirror Mask"—Is used to define the dielectric mirror 661.
  "8.5) Bond Pad Mask"—Is used to define the top bond-pad metallization 664.
  "8.6) Back Metal Mask"—Is used to define the back-side-ohmic-contact metallization 633 and the output aperture 676.
  "8.7) Full Device" shows a composite diagram of mask layers 8.1, 8.2, 8.3, 8.4, 8.5, and 8.6 and is an illustration of VCSEL device 601.

Figure 9:
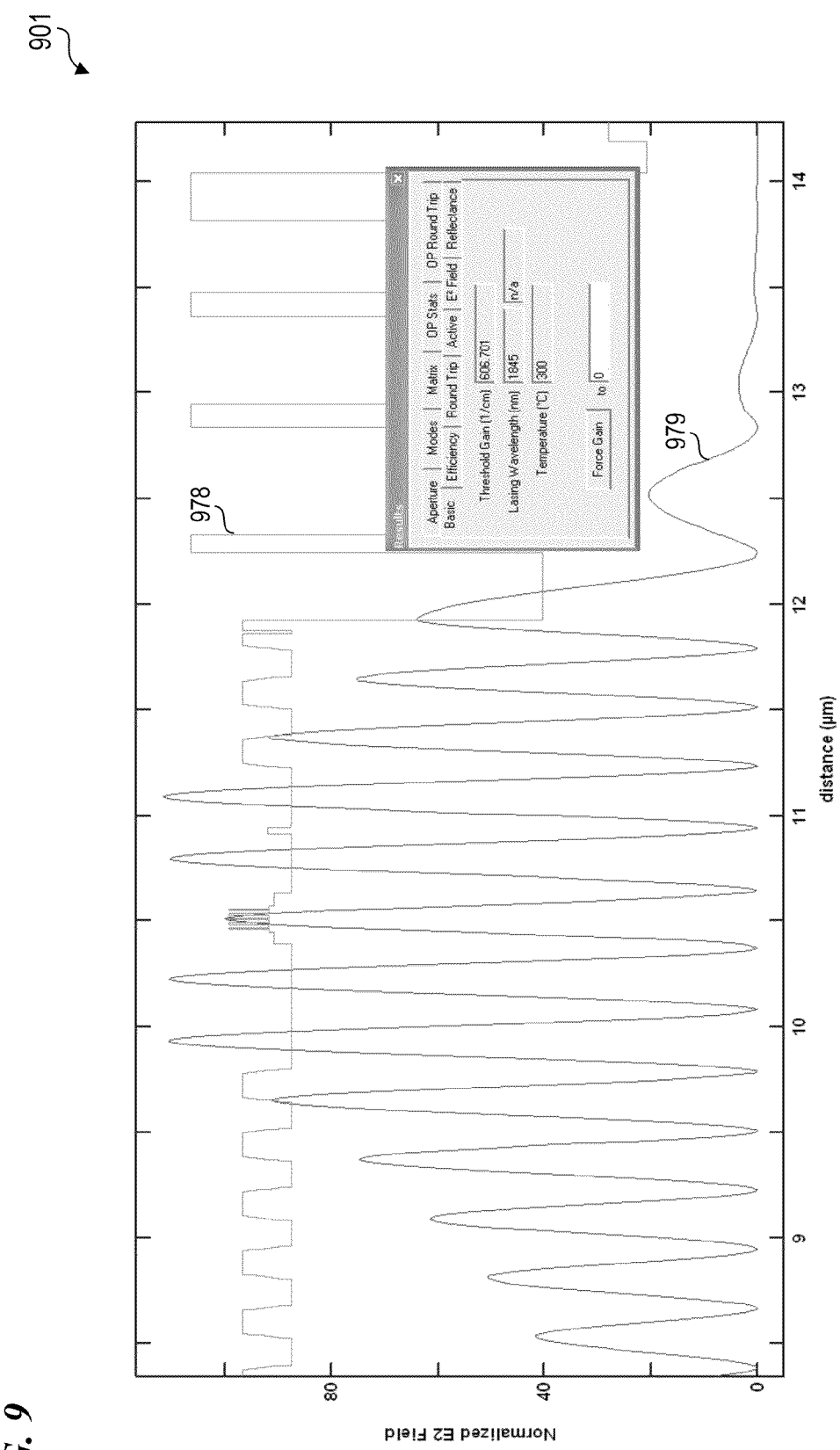
FIG. 9 is a graph 901 illustrating the refractive index profile and the electric field profile of VCSEL device 604, according to some embodiments of the present invention.

FIG. 9 is a graph 901 illustrating the refractive index profile 978 and the electric field distribution 979 of VCSEL device 601, according to some embodiments of the present invention. In some embodiments, the red curve shows the electric field distribution 979 and the green curve shows the refractive index profile 978 for a VCSEL device 601 having an active region 647 with five quantum wells, a top DBR mirror 641 having three periods, an integrated waveguide mesa 673 stopetch layer (not shown), a dielectric mirror 661 having a 0.999 reflectivity, a cavity region 640 having a 2-λ cavity thickness, a short InGaAsP separate-confinement heterostructure, an InP thermal spacer, and a tunneling junction 663 that is positioned within the epitaxial structure 640 such that the tunneling junction is positioned at a standing-wave null point of the resonant cavity.

Improved 720 nm Vertical-Cavity Surface-Emitting Laser

In some embodiments, the present invention provides an apparatus and process for VCSELs that emit laser light having a wavelength in the range of about 700 nm to about 730 nm, or more specifically a wavelength of approximately 720 nm. In some embodiments, the present invention provides a VCSEL device 1001 that includes an active region having one or more GaInP quantum-wells with GaInAlP barrier layers interposed at least between the one or more GaInP quantum wells in the active region. In some embodiments, VCSEL device 1001 further includes one or more AlGaAs-based DBR mirrors that are each grown lattice matched to a GaAs substrate.

FIG. 10A is a cross-sectional schematic of a VCSEL device 1001, according to some embodiments of the present invention. In some embodiments, VCSEL device 1001 shown in FIG. 10A is substantially similar to VCSEL device 101 shown in FIG. 1A and described above, except that VCSEL device 1001 includes a MQW 1047-1 that is formed from one or more GaInP quantum wells and GaInAlP barrier layers interposed at least between the one or more GaInP quantum wells, and a top-DBR mirror structure 1041-1 and/or a bottom-DBR mirror structure 1042-1 that is formed from alternating layers of two or more different AlGaAs material-composition layers that are each lattice matched to a GaAs substrate 1010 and emits laser light having a wavelength of about 720 nm. In some embodiments, VCSEL device 1001 includes GaInP quantum wells and GaInAlP barrier layers that emits laser light having a wavelength of about 720 nm to about 730 nm, without the need to use an AlGaAs quantum well and AlGaAs barrier layer.

FIG. 10B is a cross-sectional schematic of a VCSEL device 1002, according to some embodiments of the present invention. In some embodiments, VCSEL device 1002 shown in FIG. 10A is substantially similar to VCSEL device 104 shown in FIG. 1D and described above, except that VCSEL device 1002 includes a MQW 1047-1 that is formed from one or more GaInP quantum wells and GaInAlP barrier layers interposed at least between the one or more GaInP quantum wells, and a top-DBR mirror structure 1041-1 and/or a bottom-DBR mirror structure 1042-1 that is formed from alternating layers of two or more different AlGaAs material-composition layers that are each lattice matched to a GaAs substrate 1010 and emits laser light having a wavelength of about 720 nm.

In some embodiments, VCSEL device 1001 includes features and methods described and set-forth in U.S. Pat. No. 7,359,421 by Mary K. Brenner, et al. issued Apr. 15, 2008, titled "RED LIGHT LASER," U.S. Pat. No. RE41,738 by Mary K. Brenner, et al. issued Sep. 21, 2010, titled "RED LIGHT LASER," and United States Patent Application 2010/0220758 by Mary K. Hibbs-Brenner, et al. published Sep. 2, 2010, titled "DIRECT MODULATED MODIFIED VERTI- CAL CAVITY SURFACE EMITTING LASERS," each of which are incorporated herein in their entirety by reference.

FIG. 11A1, FIG. 11A2, and FIG. 11A3 are three parts of a schematic diagram that shows a double-oxide VCSEL device structure 1101 in table format. The double-oxide VCSEL device structure 1101 has been broken up into three separate figures each on three separate sheets (i.e., FIG. 11A1, FIG. 11A2, and FIG. 11A3) to improve readability.

FIG. 11B1 and FIG. 11B2 are two parts of a schematic diagram that shows a 720 nm VCSEL device structure 1102 in table format, according to some embodiments of the present invention. The 720 nm VCSEL device structure 1102 has been broken up into three separate figures each on a separate page (i.e., FIG. 11B1 and FIG. 11B2) to improve readability.

In some embodiments, the inventions provided herein as shown in the figures and described above are combined with various features of other inventions provided herein as well as provided in the U.S. patents and U.S. applications incorporated herein in their entirety by reference. The various features include, but are not limited to, asymmetrical mirrors, graded mirrors that are graded over a distance of about >5 nm, zinc doping that is kept approximately >30 nm away from quantum wells in the active region, metal apertures in the contact metal having a radius that is equal to or smaller than the oxide or implant aperture radius for single mode devices, metal apertures in the contact metal that is equal to or larger than the oxide or implant aperture for maximum efficiency multi-mode devices, and tensile-strained barrier layers It is to be understood that the above description is intended to be illustrative, and not restrictive. Although numerous characteristics and advantages of various embodiments as described herein have been set forth in the foregoing description, together with details of the structure and function of various embodiments, many other embodiments and changes to details will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein," respectively. Moreover, the terms "first," "second," and "third," etc., are used merely as labels, and are not intended to impose numerical requirements on their objects.

What is claimed is:

1. A method comprising:
providing a substrate;
forming a VCSEL on the substrate, wherein the forming of the VCSEL includes:
   forming a first mirror on the substrate;
   depositing a first layered semiconductor structure on the first mirror, wherein the first layered semiconductor structure includes at least a first aluminum-containing layer, a second aluminum-containing layer and a multiple-quantum-well (MQW) structure;
   depositing a second mirror on the first layered semiconductor structure;
   depositing an electrical contact on the second mirror;
   exposing edges of the first layered semiconductor structure; and
   laterally oxidizing the first aluminum-containing layer and the second aluminum-containing layer from the edges while leaving an electrically conductive first aperture in the first aluminum-containing layer and an electrically conductive second aperture in the second aluminum-containing layer;
   wherein the electrically conductive first aperture and electrically conductive second aperture differ in size.

2. The method of claim 1, further comprising forming a light-emitting aperture in the first electrical contact for outputting laser light therethrough.

3. The method of claim 1, wherein depositing the first layered semiconductor structure includes depositing the MQW structure between the first aluminum-containing layer and the first mirror.

4. The method of claim 1, wherein depositing the first layered semiconductor structure includes depositing the MQW structure between the first aluminum-containing layer and the second aluminum-containing layer.

5. The method of claim 1, wherein depositing the first layered semiconductor structure includes depositing the MQW structure between the second aluminum-containing layer and the second mirror.

6. The method of claim 1, wherein the electrically conductive first aperture is smaller than the electrically conductive second aperture.

7. The method of claim 1, wherein the electrically conductive second aperture is smaller than the electrically conductive first aperture.

8. The method of claim 1, wherein laterally oxidizing the first layer substantially blocks light electrical carriers from passing therethrough except through the first aperture and modifies a first index of refraction of the first layer, and wherein laterally oxidizing the second layer substantially blocks light electrical carriers from passing therethrough except through the second aperture and modifies a second index of refraction of the second layer.

9. The method of claim 1, further comprising:
forming a second electrical contact on the substrate;
fowling a light-emitting aperture in the first electrical contact; and
forming a light-emitting aperture in the second electrical contact.

10. An apparatus comprising:
a semiconductor substrate;
a vertical-cavity surface-emitting laser (VCSEL) formed on the substrate, wherein the VCSEL includes:
   a first mirror and a second mirror;
   a first layer located between the first mirror and the second mirror, the first layer comprising a proton implantation or an oxide having a first aperture restricting light between the first mirror and the second mirror passing through the first aperture and selecting an optical mode of the VCSEL; and
   a second layer located between the first mirror and the second mirror, the second layer comprising a proton implantation or an oxide having a second aperture restricting electrical current passing through the second aperture;
   wherein the first aperture and second aperture differ in size.

11. The apparatus of claim 10, wherein the first aperture is smaller than the second aperture.

12. The apparatus of claim 10, wherein the second aperture is smaller than the first aperture.

13. The apparatus of claim 10, further comprising:
a first electrical contact formed on the VCSEL;
a second electrical contact formed on the substrate, configured such that electrical current that flows between the first electrical contact and the second electrical contact provides pump energy to the VCSEL.

14. The apparatus of claim 13, wherein the VCSEL includes:
- a first resonating cavity formed between the first and second mirrors, wherein at least one of the first mirror and the second mirror partially transmits and partially reflects light incident on that mirror, wherein the first mirror and the second mirror are electrically conductive; and
- a multiple-quantum-well (MQW) structure located between the first mirror and the second mirror, wherein the first and second apertures act together to define a path geometry of the current through the MQW structure in order to excite laser light.

15. The apparatus of claim 14, wherein at least one of the first electrical contact and the second electrical contact has a light-emitting aperture therein for outputting laser light therethrough.

16. The apparatus of claim 14, wherein the MQW structure is located between the second aperture and the second mirror.

17. The apparatus of claim 14, wherein the MQW structure is located between the first and second apertures.

18. The apparatus of claim 14, wherein the MQW structure is located between the first aperture and the first mirror.

19. The apparatus of claim 10, wherein the first layer and second layer are each an oxide layer.

20. The apparatus of claim 19, wherein the first layer includes an aluminum oxide, and wherein the second layer includes an aluminum oxide.

21. The apparatus of claim 19, wherein the first and second layers are oxide layers as a result of exposure to an oxidation process, and wherein the first layer has a different thickness than the second layer, such that the oxidation process resulted in the difference in size of the first and second apertures.

22. The apparatus of claim 19, wherein the first and second layers are oxide layers as a result of exposure to an oxidation process, and wherein the composition of the first layer is different than the second layer, such that the oxidation process resulted in the difference in size of the first and second apertures.

23. The apparatus of claim 22, wherein the first layer comprises a different concentration of aluminum than the second layer.

24. The apparatus of claim 10, wherein the first layer and second layer are each a proton implantation.

25. The apparatus of claim 10, wherein one of the first layer and second layer is an oxide layer and the other of the first layer and second layer is a proton implantation.

26. The apparatus of claim 10, further comprising a multiple-quantum-well (MQW) structure located between the first mirror and the second mirror, the MQW comprising one or more GaInP quantum wells.

27. The apparatus of claim 26, wherein where there is more than one GaInP quantum well, further comprising, interposed between adjacent GaInP quantum wells, a GaInAlP barrier layer.

28. The apparatus of claim 27, wherein where there is more than one GaInP quantum well, further comprising, interposed between each adjacent pair of GaInP quantum wells, a GaInAlP barrier layer.

* * * * *